United States Patent
Henmi et al.

(10) Patent No.: US 7,562,184 B2
(45) Date of Patent: Jul. 14, 2009

(54) DRAM CONTROLLER FOR GRAPHICS PROCESSING OPERABLE TO ENABLE/DISABLE BURST TRANSFER

(75) Inventors: Masanori Henmi, Kyoto (JP); Kazushi Kurata, Osaka (JP)

(73) Assignee: Panasonic Corporation, Osaka (JP)

( * ) Notice: Subject to any disclaimer, the term of this patent is extended or adjusted under 35 U.S.C. 154(b) by 325 days.

(21) Appl. No.: 11/023,570

(22) Filed: Dec. 29, 2004

(65) Prior Publication Data
US 2005/0152211 A1    Jul. 14, 2005

(30) Foreign Application Priority Data

Jan. 7, 2004     (JP)     .............................. 2004-002275

(51) Int. Cl.
  G06F 12/00    (2006.01)
  G06F 12/06    (2006.01)
  G06F 13/00    (2006.01)
  G06F 13/28    (2006.01)
  G09G 5/39    (2006.01)
  G06F 13/372    (2006.01)
  G06F 12/02    (2006.01)
  G09G 5/36    (2006.01)

(52) U.S. Cl. .......................... 711/105; 711/5; 711/104; 711/153; 711/170; 345/531; 345/533; 345/534; 345/536; 345/544; 345/545; 345/570

(58) Field of Classification Search ........................ None
See application file for complete search history.

(56) References Cited

U.S. PATENT DOCUMENTS

| 5,644,747 | A | | 7/1997 | Kusuda | |
|---|---|---|---|---|---|
| 5,745,739 | A | * | 4/1998 | Wang et al. | ................. 345/569 |
| 5,877,780 | A | * | 3/1999 | Lu et al. | ..................... 345/519 |
| 6,091,863 | A | * | 7/2000 | Nakashima et al. | ......... 382/307 |
| 6,510,097 | B2 | * | 1/2003 | Fukuyama | ............. 365/230.03 |
| 6,697,907 | B1 | * | 2/2004 | Roohparvar | ................ 711/103 |
| 6,708,236 | B1 | * | 3/2004 | Date et al. | ..................... 710/35 |

(Continued)

FOREIGN PATENT DOCUMENTS

CN        1302405 A        7/2001

(Continued)

OTHER PUBLICATIONS

Chinese Office Action issued in corresponding Chinese Patent Application No. 2004101036596, dated Nov. 10, 2006.

(Continued)

*Primary Examiner*—Tuan V Thai
*Assistant Examiner*—Marwan Ayash
(74) *Attorney, Agent, or Firm*—McDermott Will & Emery LLP

(57) ABSTRACT

An interface unit 20 assigns different SDRAMs 1 and 2 to adjacent drawing blocks in a frame-buffer area. In processing that extends across the adjacent drawing blocks, active commands, for example, are issued alternately to the SDRAMs 1 and 2 to reduce waiting cycles resulting from the issue interval restriction. Furthermore, since individual clock enable signals CKE1 and CKE2 are output to the SDRAMs 1 and 2 so that burst transfers of the SDRAMs 1 and 2 can be stopped individually, no cycle is necessary to stop the burst transfers.

15 Claims, 27 Drawing Sheets

U.S. PATENT DOCUMENTS

| | | | |
|---|---|---|---|
| 6,778,177 B1 * | 8/2004 | Furtner | 345/544 |
| 7,190,368 B2 * | 3/2007 | Linzer et al. | 345/536 |
| 2002/0109693 A1 * | 8/2002 | Champion et al. | 345/536 |
| 2003/0151609 A1 * | 8/2003 | Champion | 345/571 |

FOREIGN PATENT DOCUMENTS

| | | |
|---|---|---|
| EP | 444601 A2 * | 9/1991 |
| JP | 62-008238 | 1/1987 |
| JP | 7-248963 A | 9/1995 |
| JP | 8-50573 | 2/1996 |
| JP | 2000-315173 | 11/2000 |
| JP | 2002-244920 A | 8/2002 |
| JP | 2003-114825 | 4/2003 |
| WO | WO 00/67129 | 11/2000 |

OTHER PUBLICATIONS

Japanese Office Action, with English Translation, issued in corresponding Japanese Patent Application No. JP 2004-002275, dated on Aug. 20, 2007.

* cited by examiner

FIG. 22
PRIOR ART

| SDRAM1 Bank0 Row0 | SDRAM1 Bank1 Row0 | SDRAM1 Bank2 Row1 | SDRAM1 Bank3 Row1 | SDRAM1 Bank0 Row2 |
|---|---|---|---|---|
| SDRAM1 Bank2 Row0 | SDRAM1 Bank3 Row0 | SDRAM1 Bank0 Row1 | SDRAM1 Bank1 Row1 | SDRAM1 Bank2 Row2 |
| SDRAM1 Bank0 Row3 | SDRAM1 Bank1 Row3 | SDRAM1 Bank2 Row4 | SDRAM1 Bank3 Row4 | SDRAM1 Bank0 Row5 |

| Col. 0 | Col. 1 | Col. 2 | Col. 3 | Col. 4 | Col. 5 | Col. 6 | Col. 7 | Col. 0 |
|--------|--------|--------|--------|--------|--------|--------|--------|--------|
| Col. 8 | Col. 9 | Col. 10 | Col. 11 | Col. 12 | Col. 13 | Col. 14 | Col. 15 | Col. 8 |
| Col. 16 | Col. 17 | Col. 18 | Col. 19 | Col. 20 | Col. 21 | Col. 22 | Col. 23 | Col. 16 |
| | | | SDRAM1 Bank0 Row0 | | | | | |
| Col. 118 | Col. 119 | Col. 220 | Col. 221 | Col. 222 | Col. 223 | Col. 224 | Col. 225 | Col. 118 |
| Col. 0 | Col. 1 | Col. 2 | Col. 3 | Col. 4 | Col. 5 | Col. 6 | Col. 7 | Col. 0 |

PRIOR ART

__US 7,562,184 B2__

DRAM CONTROLLER FOR GRAPHICS PROCESSING OPERABLE TO ENABLE/DISABLE BURST TRANSFER

CROSS-REFERENCE TO RELATED APPLICATION

This application is related to Japanese Patent Application No. 2004-2275 filed on Jan. 7, 2004, whose priority is claimed under 35 USC §119, the disclosure of which is incorporated herein by reference in its entirety.

BACKGROUND OF THE INVENTION

The present invention relates to technology for controlling access to DRAMs capable of burst transfers, for the purpose of, e.g., graphics processing.

In most of the current graphics processors, a dedicated video memory is not used, and instead a frame-buffer area is provided, together with other process data, in an SDRAM (synchronous DRAM) for cost reduction. In those graphics processors, to write graphic data into the frame-buffer area, the pixel positions and pixel data of the graphic data are calculated and the pixel data is written into the frame-buffer area in the SDRAM in accordance with the pixel positions. On the other hand, to display drawing data stored in the frame-buffer area on a display unit, pixel data at each pixel position is sequentially read for display, in synchronization with raster scanning of the display screen.

As described above, when a general data area and a frame-buffer area are both provided in an SDRAM to achieve cost reduction, the band width necessary for accessing the SDRAM increases more and more.

When being accessed in the order of address, SDRAM has an advantage in that the overhead required in the access can be reduced by the burst transfer capability. On the other hand, a disadvantage of SDRAM is that when access is made in no order of address, a precharge command and an active command have to be input to the SDRAM every time such access is made. It is thus apparent that significant overhead occurs in, e.g., display processing or processing in which a large amount of line segment data is written, if addresses and pixel data are simply associated with each other on a one-to-one basis.

A conventional technique for solving this problem will be discussed.

In the following descriptions, SDRAMs each including four banks will be exemplified as DRAMs. It is assumed that in the SDRAMs, the data line width is 32 bits and the number of column addresses per row address is 256. It is also assumed that the restriction that one cycle has to be waited between issuing active commands is imposed as command-issuing interval restriction (/RAS to /RAS bank active delay: tRRD). In the following descriptions, it is also assumed that CS (chip select signal) and CKE (clock enable signal), which are control signals for the SDRAMs, are negative logic signals.

Moreover, in the descriptions, selecting a row address in a bank included in a DRAM will be referred to as "activate a row address". A set of control signals that is input to a DRAM to make the DRAM perform a particular operation will be referred to as a "command". For example, a set of control signals input to a DRAM in order to activate a particular row address will be referred to as an "active command".

FIG. 20 is a block diagram schematically illustrating the configuration of a conventional DRAM controller. FIG. 21 is a block diagram illustrating the internal configuration of an interface unit 120 of FIG. 20. In FIG. 20, the reference marks 101A, 101B, and 102 denote a first SDRAM (SDRAM1), a second SDRAM (SDRAM2), and a microprocessor for accessing the first and second SDRAMs 101A and 101B. The reference marks CS1 and CS2 indicate chip select signals, and CKE denotes a clock enable signal. The reference marks RAS, CAS, and WE denote control signals for issuing commands, while BA indicates a bank select signal.

FIG. 22 shows exemplary address mapping in a frame-buffer area in the configuration shown in FIGS. 20 and 21. In FIG. 22, a section designated by (SDRAM1, Bank0, Row2), e.g., represents a drawing block BL which has capacity for storing data indicated by a single row address. And in this case, each single row address includes 256 column addresses.

FIG. 23 illustrates the details of address mapping in a single drawing block. In the example of FIG. 23, 256 column addresses included in the single drawing block are two-dimensionally mapped in 8 columns in the horizontal direction and in 32 lines in the vertical direction. Each column address has a memory element of 32 bits. Thus, in the case of storage of drawing data including 8 bits per pixel, 4 pixels of the drawing data can be stored in each column address.

An access operation performed in the conventional configuration shown in FIGS. 20 and 21 will be described.

(1) Display processing (FIG. 24)

(Step 1)

In the interface unit 120, a CPU 201 sets, in a graphics parameter register, transfer start coordinates, a frame number, drawing data information (color depth, rectangle/line), the amount of words in horizontal width, and the number of lines in vertical width.

(Step 2)

The CPU 201 outputs to a control unit 205 a request signal that indicates transfer request.

(Step 3)

The control unit 205 first outputs to the CPU 201 an acknowledge signal for accepting the transfer request, and then refers to the graphics parameter register 203 to determine which four banks are to be activated, based on the amount of words in horizontal width and the number of lines in vertical width. In this case, (SDRAM1, Bank0, Row0), (SDRAM1, Bank1, Row0), (SDRAM1, Bank2, Row1), and (SDRAM1, Bank3, Row1) are each activated. The control unit 205 then refers to an active row address storage unit 207 to check which banks are currently active and determines whether or not a precharge command/active command has to be issued. In this case, it is assumed that the issuance is not necessary.

(Step 4)

A two-dimensional address generating unit 204 refers to the graphics parameter register 203 to calculate an address on the SDRAM, from which the writing is to be started, based on the transfer start coordinates, the frame number and the drawing data information. The two-dimensional address generating unit 204 then outputs the calculated bank Bank, row address Row, and column address Col to an address/control-signal output unit 208.

(Step 5)

The control unit 205 starts a state transition as shown in FIG. 24B for generating control signals to the SDRAM1. For example, the control unit 205 instructs the address/control-signal output unit 208 to generate an active command in a cycle T1.

(Step 6)

The address/control-signal output unit 208 first determines into which of the SDRAM1 and the SDRAM 2 the writing is to be performed, based on the row address Row output from the two-dimensional address generating unit 204. And based on the determination result, the address/control-signal output unit 208 generates chip select signals CS1 and CS2. Also, from the bank Bank and row address Row output from the two-dimensional address generating unit 204, the address/control-signal output unit 208 outputs an active command (control signals RAS, CAS, and WE) for activating (SDRAM1, Bank0, Row0).

(Step 7)

Subsequently, in accordance with the issue interval restriction tRRD, the address/control-signal output unit 208 outputs an active command for activating (SDRAM1, Bank1, Row0) in a cycle T3.

(Step 8)

At a cycle T4, which satisfies the issue interval restriction tRRD with respect to the cycle T1, it is possible to issue a read command. Therefore, a read command for (SDRAM1, Bank0, Row0) is output.

(Step 9)

Subsequently, in cycles T5 and T7, active commands for respectively activating (SDRAM1, Bank2, Row1) and (SDRAM1, Bank3, Row1) are output.

(Step 10)

In a cycle T12, a read command for (SDRAM1, Bank1, Row0) is output. Thereafter, when access moves to (SDRAM1, Bank2, Row1) and (SDRAM1, Bank3, Row1), read commands are output similarly.

(Step 11)

In cycles S1 and S3, a precharge command for (SDRAM1, Bank0) and an active command for (SDRAM1, Bank0, Row2) are respectively issued.

(Step 12)

In a cycle S5, a read command for (SDRAM1, Bank0, Row2) is issued.

As described above, the burst transfer capability of the SDRAMs permits the precharge and active commands to be issued together, while the read operation is performed. In this processing, no overhead is therefore produced when the bank boundaries are accessed.

(2) Writing of line segment data (FIG. 25)

As shown in FIG. 25, an operation for consecutively writing two line-segment data items (line segments 1 and 2) will be discussed.

In cycles T1 and T3, (SDRAM1, Bank0, Row0) and (SDRAM1, Bank3, Row0) are each activated. The activation operation is performed in the same manner as described in the display processing.

Then, in cycles T4 through T8, the line segment data of the line segment 1 is written into the drawing block (SDRAM1, Bank0, Row0). In cycles T9 through T15, the line segment data of the line segment 2 is written into the drawing block (SDRAM1, Bank3, Row0). In this case, since the column addresses into which the data items are written are not consecutive, each column address has to be output for each data item.

By the above described configuration and operations, the following effects are achieved.

(1) No overhead occurs when the frame-buffer area is read in the horizontal direction. As a result, the access time required in the display processing is reduced.

(2) Although description is omitted herein, when rectangular data of relatively large size is written, use of the SDRAMs' burst transfer capability allows pipeline access as well as a horizontal read operation, thus causing no overhead.

(3) When short line segment data and a small rectangle are written, the possibility that they are in the same row address increases. Consequently, no overhead occurs when such single drawing data is written.

In other words, the above-mentioned configuration and operations solve to some extent the conventional problem that the bandwidth increases when the frame-buffer area is accessed.

However, there still remains a problem with the conventional technique in that significant overhead may occur when DRAM is accessed in some processing, which means that the conventional technique has been insufficient to solve the above problem.

FIG. 26 illustrates an operation in which rectangles (rectangles 1 and 2), of a horizontal width of two words and having therein three lines in the vertical direction, are rendered into the frame-buffer area. As shown in FIG. 26A, the rectangle 1 extends across four drawing blocks (SDRAM1, Bank0, Row0), (SDRAM1, Bank1, Row0), (SDRAM1, Bank2, Row0), and (SDRAM1, Bank3, Row0), while the rectangle 2 extends across four drawing blocks (SDRAM1, Bank1, Row1), (SDRAM1, Bank2, Row2), (SDRAM1, Bank3, Row4), and (SDRAM1, Bank0, Row5).

As shown in FIG. 26B, writing the rectangles 1 and 2 consecutively requires as much as 24 cycles in total from T1 to T24. In this case, one reason for the occurrence of overhead is that a write command needs to be issued in succession in each cycle because the horizontal width of the rectangles is short, and a precharge command and an active command cannot be issued together with the write command.

FIG. 27 illustrates an operation in which line-segment data (line segment 3) is vertically written into the frame-buffer area. As shown in FIG. 27A, the line segment 3 extends across three drawing blocks (SDRAM1, Bank0, Row0), (SDRAM1, Bank2, Row0) and (SDRAM1, Bank0, Row3.)

As shown in FIG. 27B, cycles S3 and S5, e.g., in which no data can be written, occur. In this case, as in the case of FIG. 26, one reason for causing overhead is that a write command has to be issued in succession in each cycle, and a precharge command and an active command cannot be issued together with the write command.

As can be seen from FIG. 20, in the conventional configuration, when the plurality of SDRAMs are connected to increase the SDRAM capacity, all of the SDRAMs use in common all signal lines but a chip select signal line. Due to this, all of the SDRAMs have to be refreshed simultaneously, and during the refresh operation, no read/write operations from/into the SDRAMs can be performed. In addition, along with the trend toward increasingly greater amounts of process data, SDRAM capacity also increases correspondingly, resulting in an increase in refresh time in the SDRAM access bandwidth.

In view of the above problem, an object of the present invention is that in DRAM control in which graphics processing is performed by using DRAMs capable of burst transfers as a frame-buffer area(s), overhead is reduced to lessen the number of cycles required to access the DRAMs as compared with the conventional case, e.g., in processing which extends across a plurality of drawing blocks or in processing in which the frame-buffer areas are used.

SUMMARY OF THE INVENTION

In order to achieve the object, a first invention is a DRAM controller that includes a plurality of DRAMs capable of burst transfers, and an interface unit which assigns to the DRAMs a frame-buffer area including a plurality of two-dimensionally arranged drawing blocks, and accesses the DRAMs in accordance with graphics processing, wherein the interface unit assigns different ones of the DRAMs to neighboring ones of the drawing blocks at least in part of the frame-buffer area, and includes a burst transfer control unit for outputting individual signals for stopping burst transfer to the DRAMs.

According to this invention, in processing which extends across the neighboring drawing blocks, for example, in a write operation of a rectangle extending across the boundary between the neighboring drawing blocks, since the different DRAMs are assigned to those neighboring drawing blocks, issuance of, e.g., active commands alternately to the DRAMs reduces the number of command-issue waiting cycles resulting from the issue interval restriction. Furthermore, the burst transfer control unit outputs the individual signals for stopping burst transfers to the DRAMs. Therefore, when the processing has passed across the boundary between the drawing blocks, the write to or the read from the DRAM assigned to the previous drawing block can be reliably stopped, requiring no cycle for stopping the burst transfer. This reduces overhead caused when the processing passes across the boundary between the drawing blocks. As a result, the DRAM access is executed with a smaller number of cycles as compared with the conventional case.

In the first inventive controller, the DRAMs preferably includes first and second DRAMs, and the interface unit preferably assigns the first and second DRAMs to the drawing blocks in the frame-buffer area in a checkered pattern.

Also, in the first inventive controller, the interface unit preferably includes an address control unit for outputting individual bank select signals and individual address signals to the DRAMs.

Moreover, the interface unit preferably assigns regions that have row addresses whose difference is 0 or 1 in the different DRAMs, to the neighboring drawing blocks at least in the part of the frame-buffer area, and the address control unit preferably outputs individual 0th bits of the address signals to the DRAMs, while outputting common remaining bits thereof to the DRAMs.

In the first inventive controller, the interface unit preferably includes a command control unit which is configured so as to be capable of issuing individual control commands to the DRAMs.

The command control unit is preferably capable of issuing a read command or a write command to one of the DRAMs and issuing a precharge command to another one of the DRAMs, in a common cycle. Furthermore, the command control unit is preferably capable of outputting a precharge signal together with issuing the precharge command.

In the first inventive controller, the interface unit preferably includes a read control unit for controlling validity/invalidity of read data from the DRAMs individually.

A second invention is a DRAM controller that includes a plurality of DRAMs capable of burst transfers, and an interface unit which assigns each of a plurality of frame-buffer areas including a plurality of two-dimensionally arranged drawing blocks to any one of the DRAMs, and accesses the DRAMs in accordance with graphics processing, wherein the interface unit assigns different ones of the DRAMs to the respective frame-buffer areas, and includes a burst transfer control unit for outputting individual signals for stopping burst transfer to the DRAMs.

In the inventive DRAM controller, in processing in which the plurality of frame-buffer areas are used, issuance of, e.g., active commands alternately to the DRAMs reduces the number of command-issue waiting cycles resulting from the issue interval restriction, because the different DRAMs are assigned to those frame-buffer areas. Furthermore, the burst transfer control unit outputs the individual signals for stopping burst transfers to the DRAMs. Therefore, when the frame-buffer area is switched from one to another, the write to or the read from the DRAM assigned to the previous frame-buffer area can be reliably stopped, requiring no cycle for stopping the burst transfer. This reduces overhead occurring when the plurality of frame-buffer areas are used. As a result, the DRAM access is executed with a smaller number of cycles as compared with the conventional case.

A third invention is a control method in the DRAM controller of the first invention, which method includes: a step in which the interface unit receives an instruction to perform graphics processing that extends across adjacent first and second drawing blocks to which first and second DRAMs included in the DRAMs have been respectively assigned; a step in which in accordance with the instruction, the interface unit instructs the first DRAM to perform a burst write to or a burst read from an area corresponding to the first drawing block; and a step in which in accordance with the instruction, the interface unit instructs the second DRAM to perform a burst write to or a burst read from an area corresponding to the second drawing block, while the burst transfer control unit outputs to the first DRAM the signal for stopping burst transfer.

A fourth invention is a control method in the DRAM controller of the second invention, which method includes: a step in which the interface unit receives an instruction to perform graphics processing using first and second frame-buffer areas assigned respectively to first and second DRAMs included in the DRAMs; a step in which in accordance with the instruction, the interface unit instructs the first DRAM to perform a burst write or a burst read of part to be processed in the first frame-buffer area; and a step in which in accordance with the instruction, the interface unit instructs the second DRAM to perform a burst write or a burst read of part to be processed in the second frame-buffer area, while the burst transfer control unit outputs to the first DRAM the signal for stopping burst transfer.

As described above, according to the present invention, in processing that extends across drawing blocks, or in processing in which a plurality of frame-buffer areas are used, the number of cycles required for DRAM access can be reduced as compared with the conventional case.

BRIEF DESCRIPTION OF THE DRAWINGS

FIG. 22 illustrates exemplary address mapping in a conventional frame-buffer area.

FIG. 23 illustrates the details of address mapping in a single drawing block.

DESCRIPTION OF THE PREFERRED EMBODIMENTS

Hereinafter, embodiments of the present invention will be described with reference to the accompanying drawings. In the following embodiments, it is assumed that DRAMs capable of burst transfers are SDRAMs (synchronous DRAMs) each having four banks. Command-issuing interval restriction (/RAS to /RAS bank active delay: tRRD) is at least two cycles. It should be noted that these assumptions are made for the sake of convenience in describing the following embodiments and that the present invention is also applicable to other structures.

First Embodiment

Figure 1:
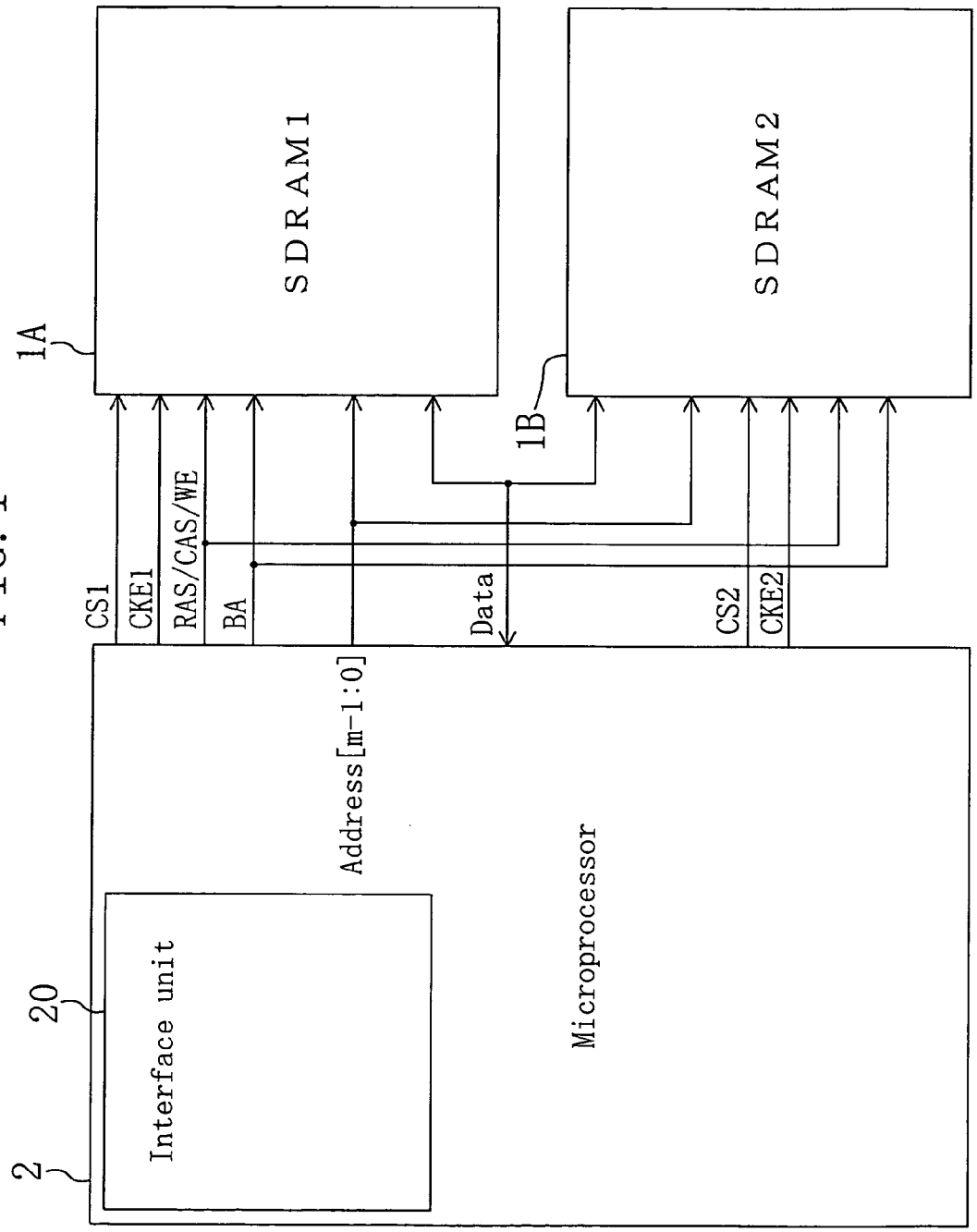
FIG. 1 illustrates a schematic configuration of a DRAM controller in accordance with a first embodiment of the present invention.

FIG. 1 illustrates a schematic configuration of a DRAM controller in accordance with a first embodiment of the present invention. In FIG. 1, a first SDRAM 1A (SDRAM1) and a second SDRAM 1B (SDRAM2) are connected to a microprocessor 2. An interface unit 20 provided in the microprocessor 2 assigns a frame-buffer area to the first and second SDRAMs 1A and 1B and accesses the first and second SDRAMs 1A and 1B in accordance with graphics processing such as drawing processing and display processing.

Figure 2:
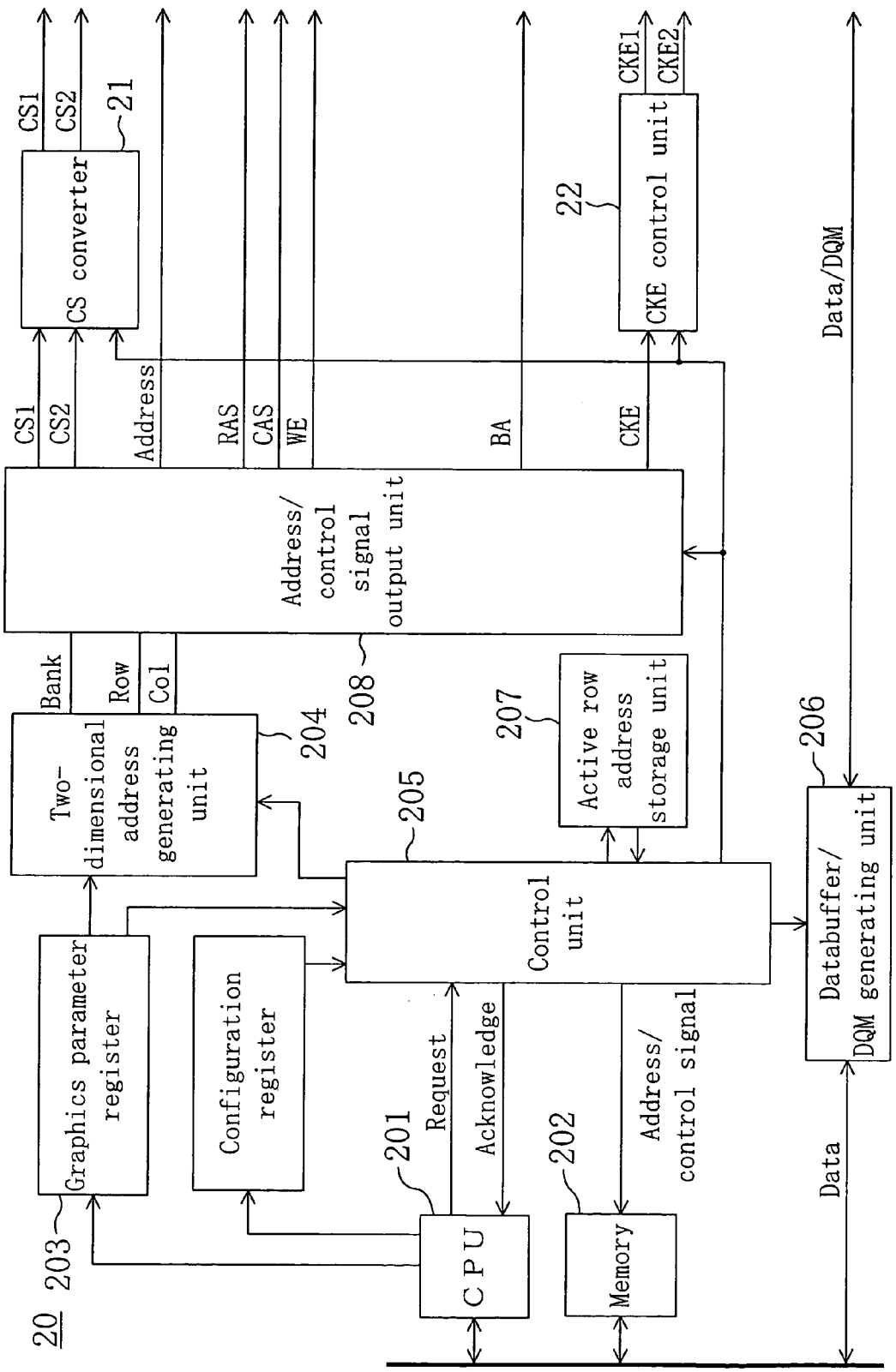
FIG. 2 is a block diagram illustrating the configuration of an interface unit of FIG. 1.
Figure 21:
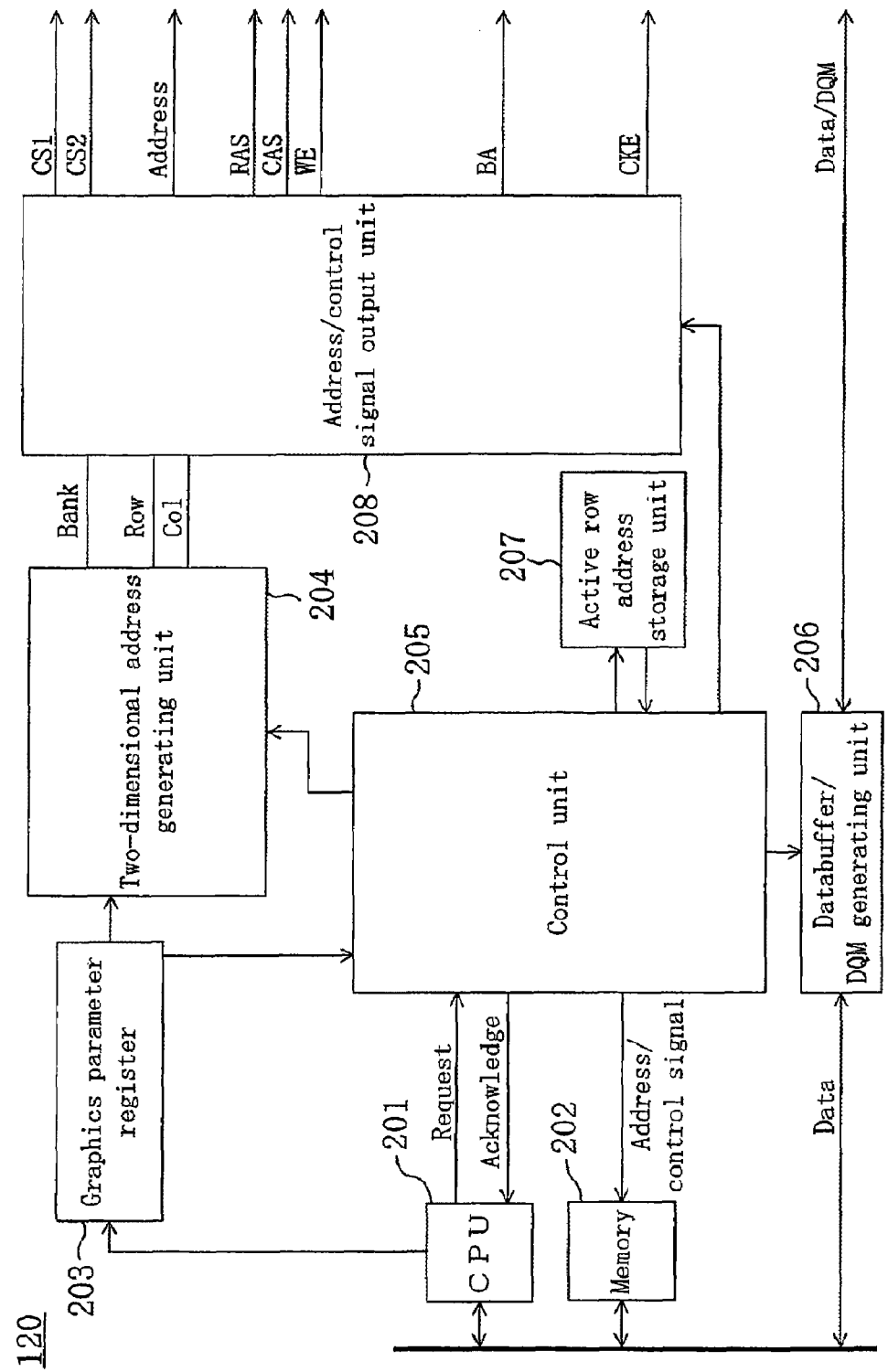
FIG. 21 illustrates the internal configuration of an interface unit of FIG. 20.
Figures 24A, 24B:
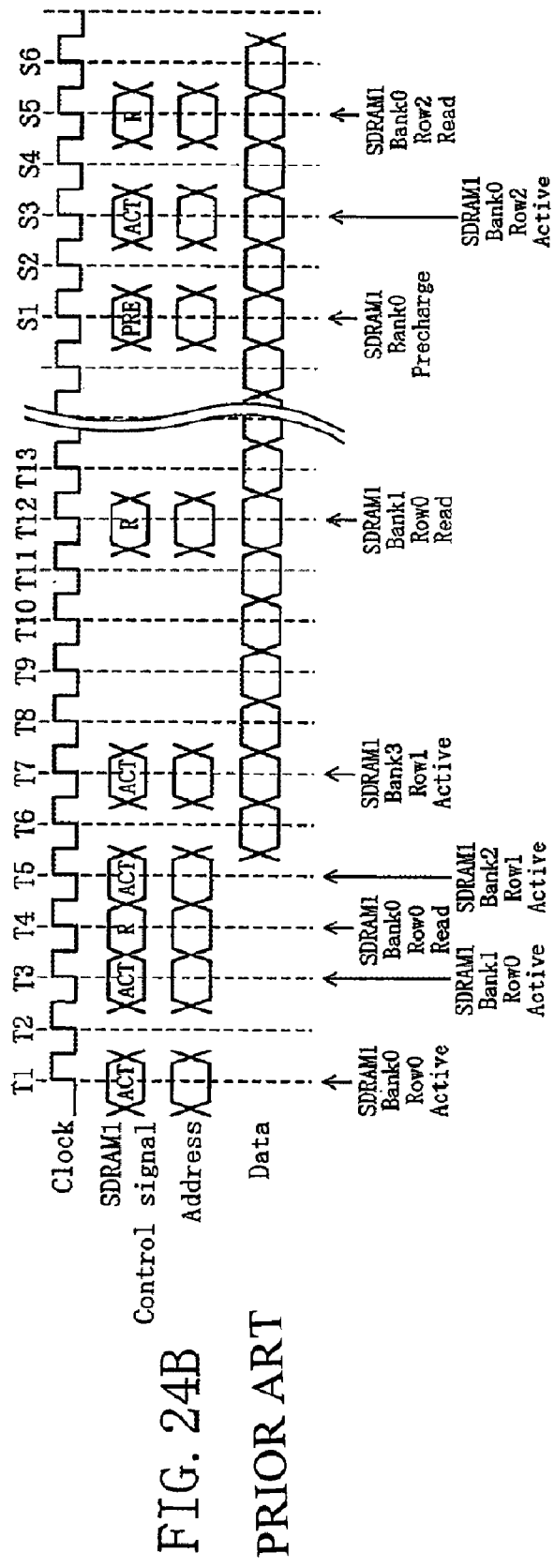
FIG. 24 indicates a display processing operation performed in the conventional configuration.
Figures 25A, 25B:
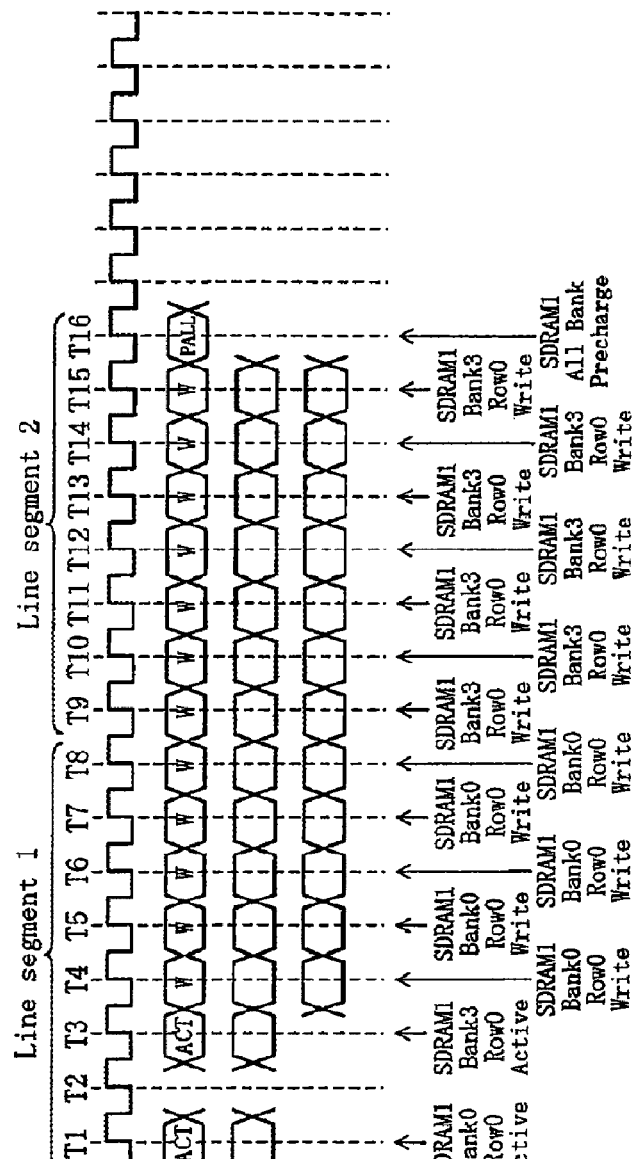
FIG. 25 indicates a write operation of line-segment data performed in the conventional configuration.

FIG. 2 is a block diagram illustrating the configuration of the interface unit 20 of FIG. 1. In FIG. 2, components common to those in the conventional configuration shown in FIG. 21 are identified by the same reference numerals and the detailed description thereof will be omitted herein. The reference numeral 21 denotes a CS (chip select signal) converter and 22 denotes a CKE (clock enable signal) control unit. The CKE control unit 22, serving as a burst transfer control unit, outputs individual first and second clock enable signals CKE1 and CKE2 to the first and second SDRAMs 1A and 1B, respectively.

Figure 3:
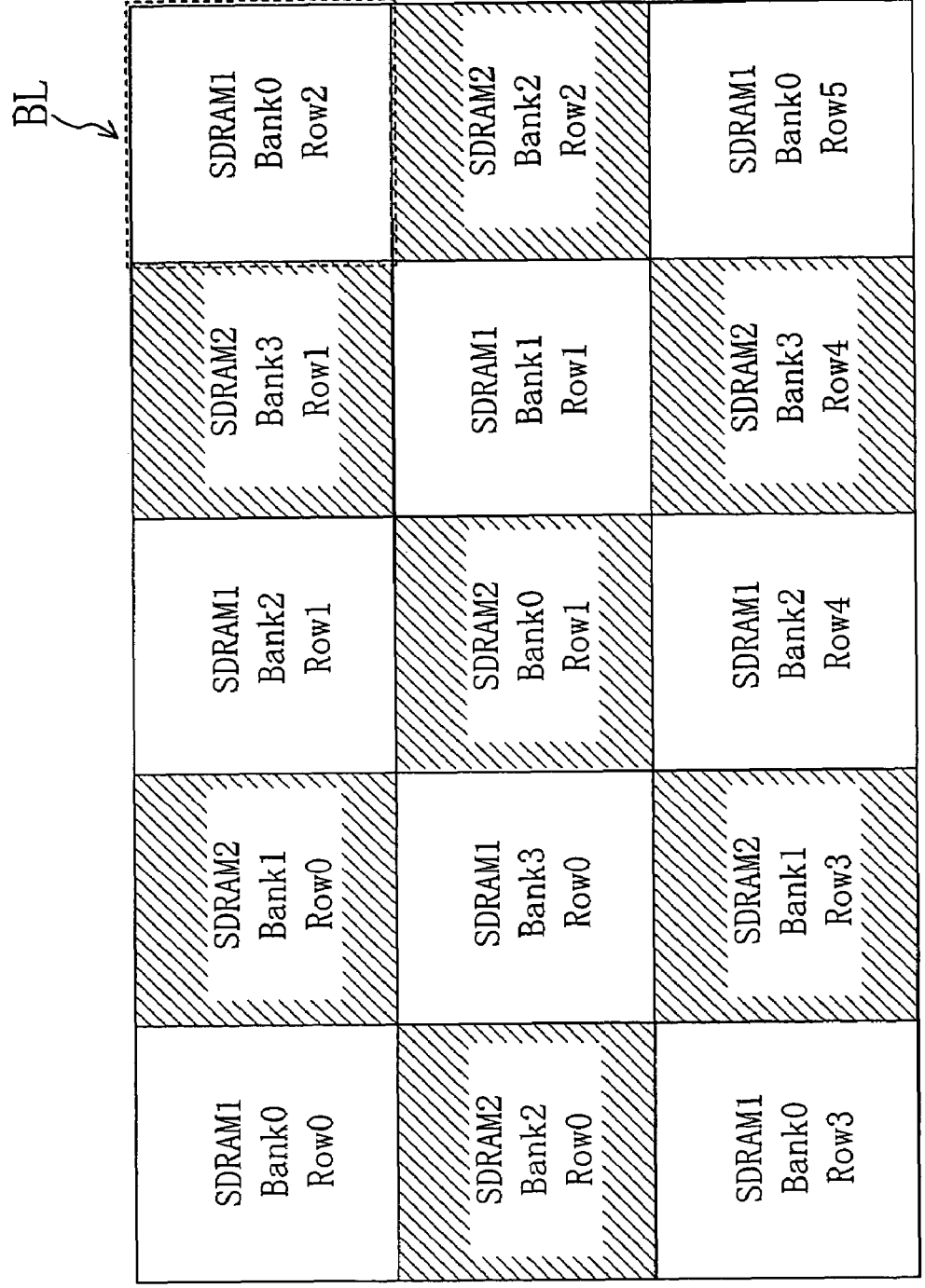
FIG. 3 illustrates exemplary address mapping in a frame-buffer area.

FIG. 3 indicates exemplary address mapping in the frame-buffer area in this embodiment. The frame-buffer area is formed of a plurality of two-dimensionally arranged drawing blocks BL. In the example of FIG. 3, the first and second SDRAMs 1A and 1B (SDRAM1, 2) are assigned alternately to the drawing blocks so as to form a checkered pattern. By this assignment, the different SDRAMs are mapped to any neighboring drawing blocks.

Figure 4:
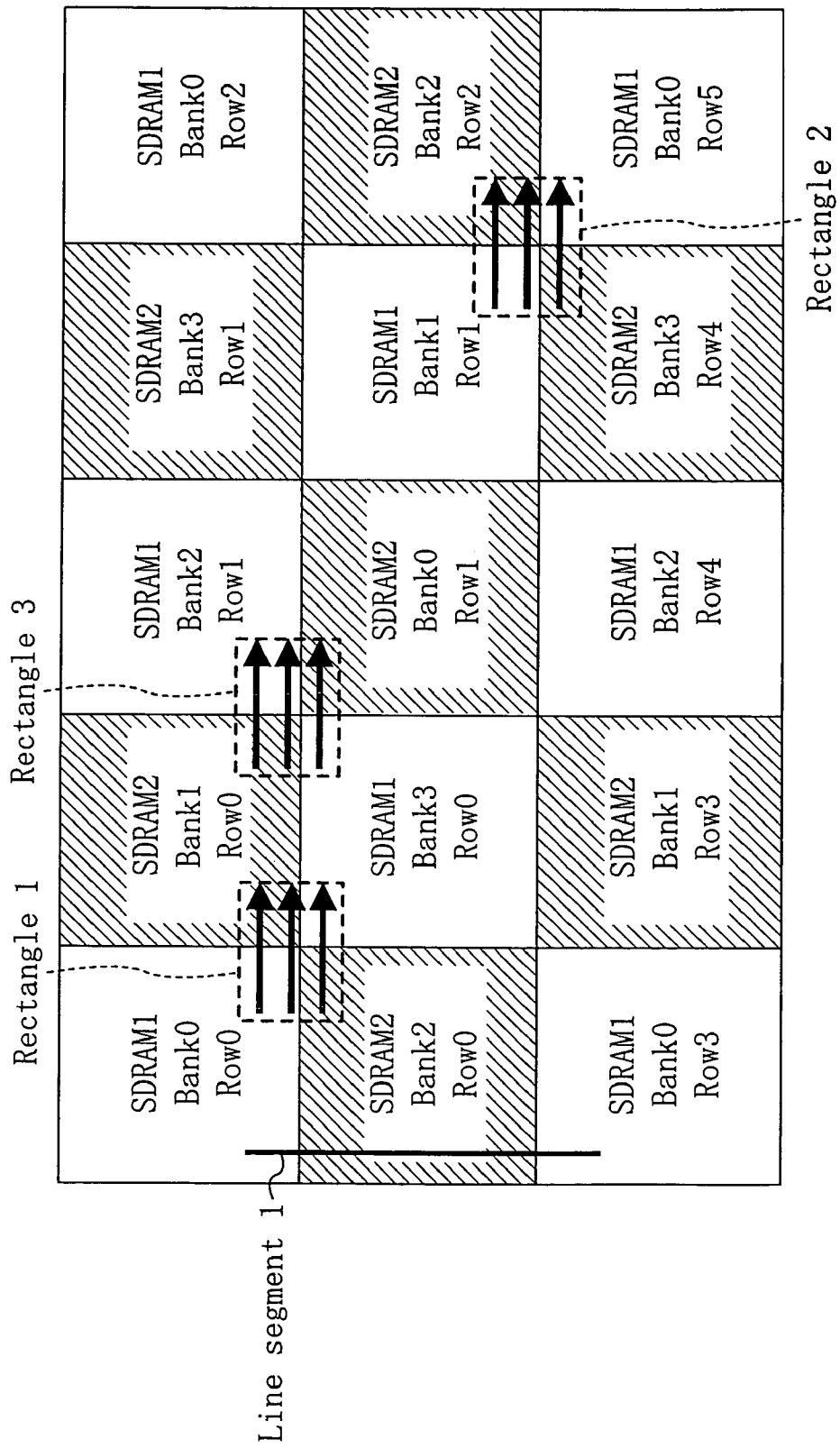
FIG. 4 illustrates an example of graphics processing of FIG. 3.

Now, a write operation in which rectangles 1 and 2 shown in FIG. 4 are consecutively written will be described by way of example of operation of the DRAM controller shown in FIGS. 1 and 2 with reference to a timing chart shown in FIG. 5.

First, to write the rectangle 1, an active command is issued in each of cycles T1, T2, T3 and T4. This means that four drawing blocks (SDRAM1, Bank0, Row0), (SDRAM2, Bank1, Row0), (SDRAM1, Bank3, Row0), and (SDRAM2, Bank2, Row0), across which the rectangle 1 extends, are each activated. Upon receipt of chip select signals CS1 and CS2 output from an address/control-signal output unit 208, the CS converter 21 converts the signals CS1 and CS2 so that the signal CS1 is activated in the cycles T1 and T3 and the signal CS2 is activated in the cycles T2 and T4, before outputting the signals CS1 and CS2.

In this manner, the SDRAM1 and the SDRAM2 are activated alternately, whereby the active-command issuing interval is shortened, while satisfying the command-issuing interval restriction tRRD.

Figure 26A:
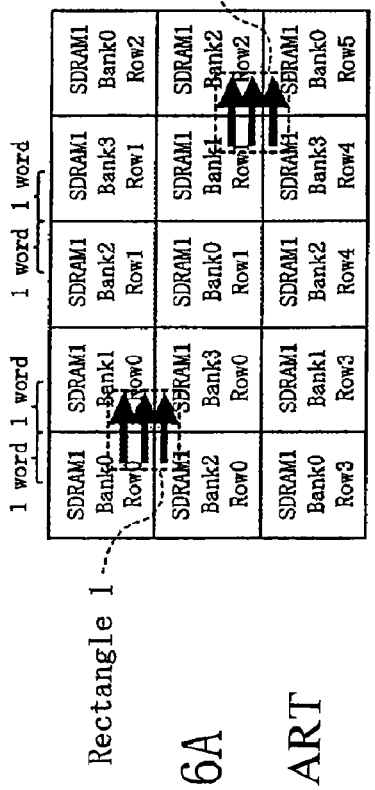
FIG. 26 illustrates an operation in which rectangles that extends across drawing blocks are successively rendered, performed in the conventional configuration.
Figure 26B:
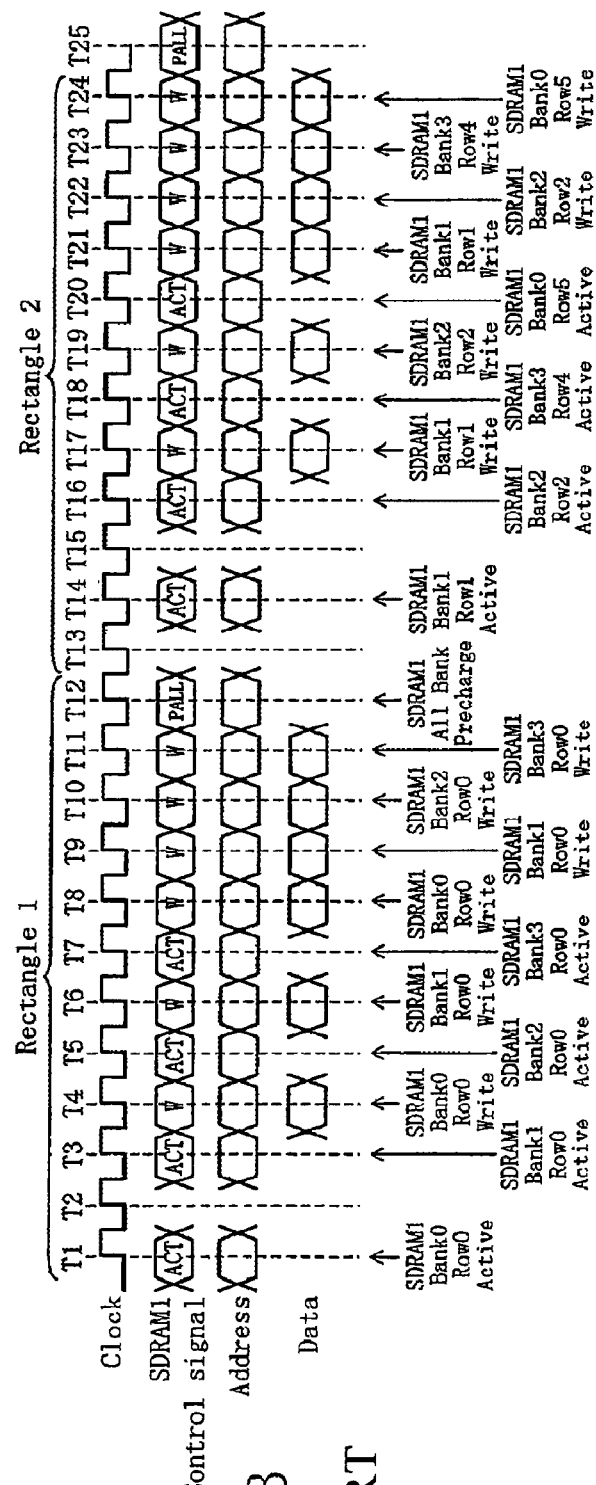
Figures 27A, 27B:
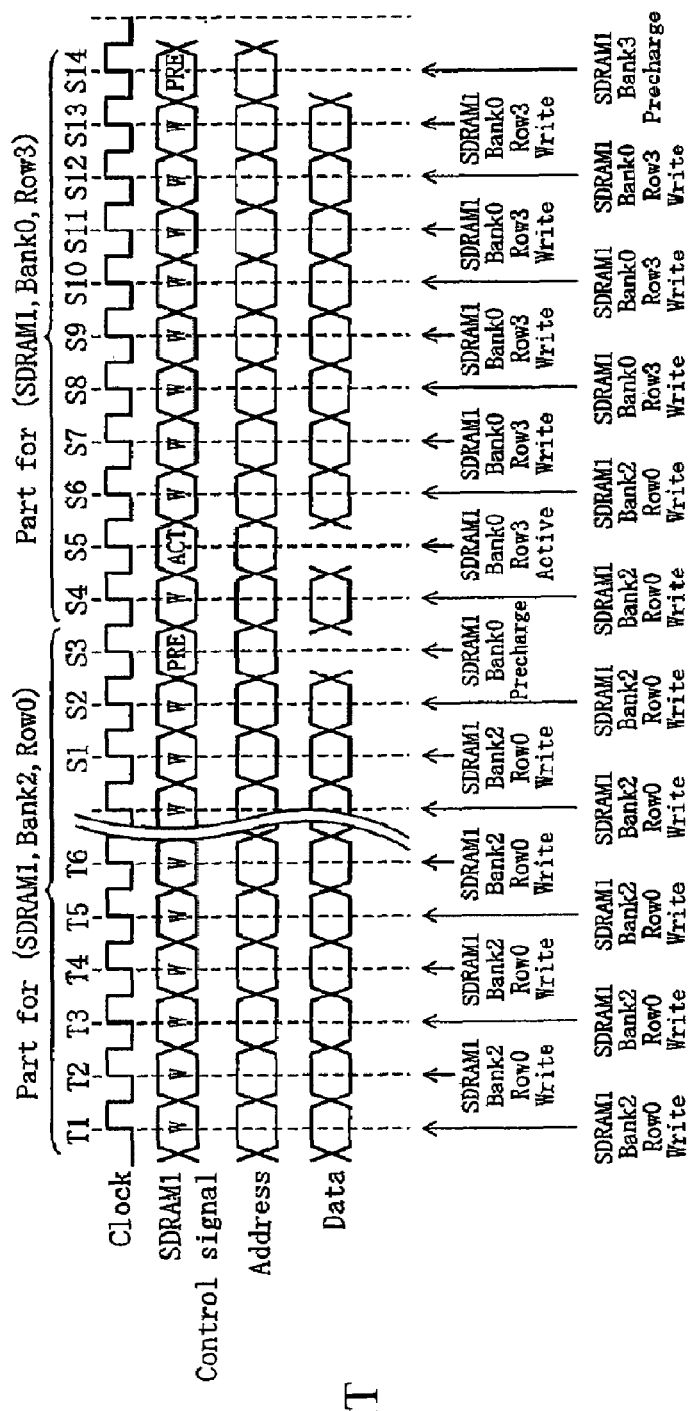
FIG. 27 illustrates an operation in which line-segment data is written in the vertical direction, performed in the conventional configuration.

Write commands are output in cycles T5 through T10 in the manner already described in FIG. 26B. However, in this embodiment, since the frame-buffer-area address mapping shown in FIG. 3 is employed, the CS converter 21 activates the signal CS1 in the cycles T5, T7, and T10, while activating the signal CS2 in the cycles T6, T8, and T9.

Nevertheless, in performing the above-described write operation in the mapping of FIG. 3, if a write command is issued to the SDRAM1 in the cycle T5, for example, the burst write into the SDRAM1 will be continued in the cycle T6. As a result, data to be written into the SDRAM2 in the cycle T6 will be also written into the SDRAM1.

To avoid this problem, the DRAM controller of this embodiment is designed so that the burst transfers of the first and second SDRAMs 1A and 1B can be stopped individually. More specifically, the CKE control unit 22 activates a first clock enable signal CKE1 in the cycle T6 to stop the burst write of the first SDRAM 1A. Similarly, in the cycles T8 and T9, the CKE control unit 22 activates the first clock enable signal CKE1. The CKE control unit 22 activates a second clock enable signal CKE2 in the cycles T7 and T10 to stop the burst write of the second SDRAM 1B.

Next, in a cycle T11, a precharge command for all banks is output to both SDRAM1 and SDRAM2. Subsequently, writing of drawing data of the rectangle 2 is carried out. Since the drawing data of the rectangle 2 is written in the same manner as the drawing data of the rectangle 1, the detailed description thereof will be omitted herein.

Figure 5:
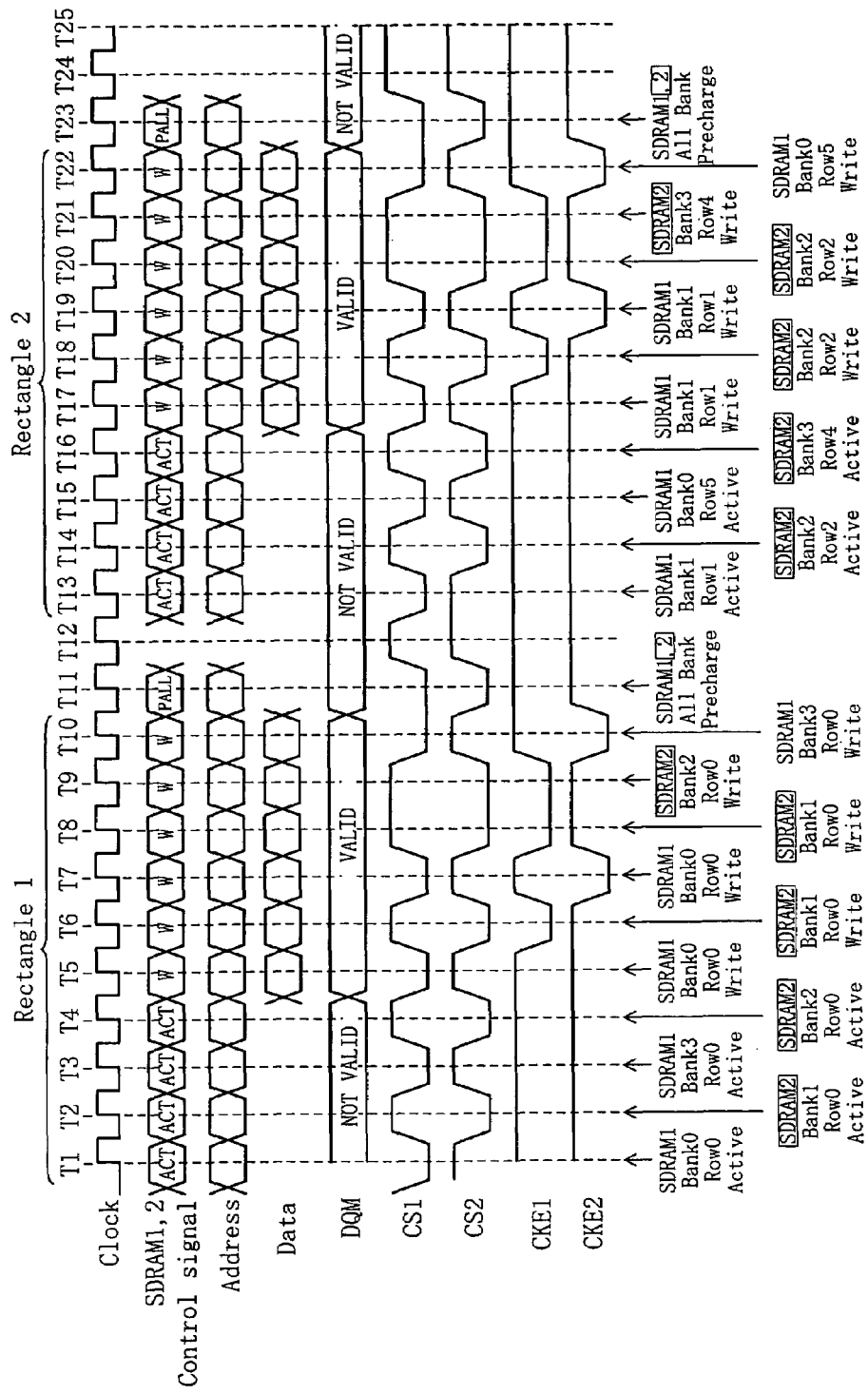
FIG. 5 is a timing chart indicating operation of the configuration shown in FIGS. 1 and 2.

Accordingly, in this embodiment the number of cycles required for the consecutive writing of the rectangles 1 and 2 is 22, from T1 to T22, as shown in FIG. 5. The required number of access cycles is reduced by two cycles as compared with the conventional case shown in FIG. 26. The same effects are also obtained in read operations.

More specifically, in this embodiment, when data which extends across neighboring drawing blocks is processed, the number of command-issue waiting cycles resulting from the issue interval restriction is reduced, because the different DRAMs are assigned to those adjoining drawing blocks. In addition, since writing to or reading from each DRAM is reliably stopped by the clock enable signal, no cycle is necessary for stopping the burst transfer.

Consequently, overhead caused when the processing passes across the drawing blocks is reduced, allowing the DRAM access to be executed with a smaller number of cycles as compared with the conventional case.

Figure 6:
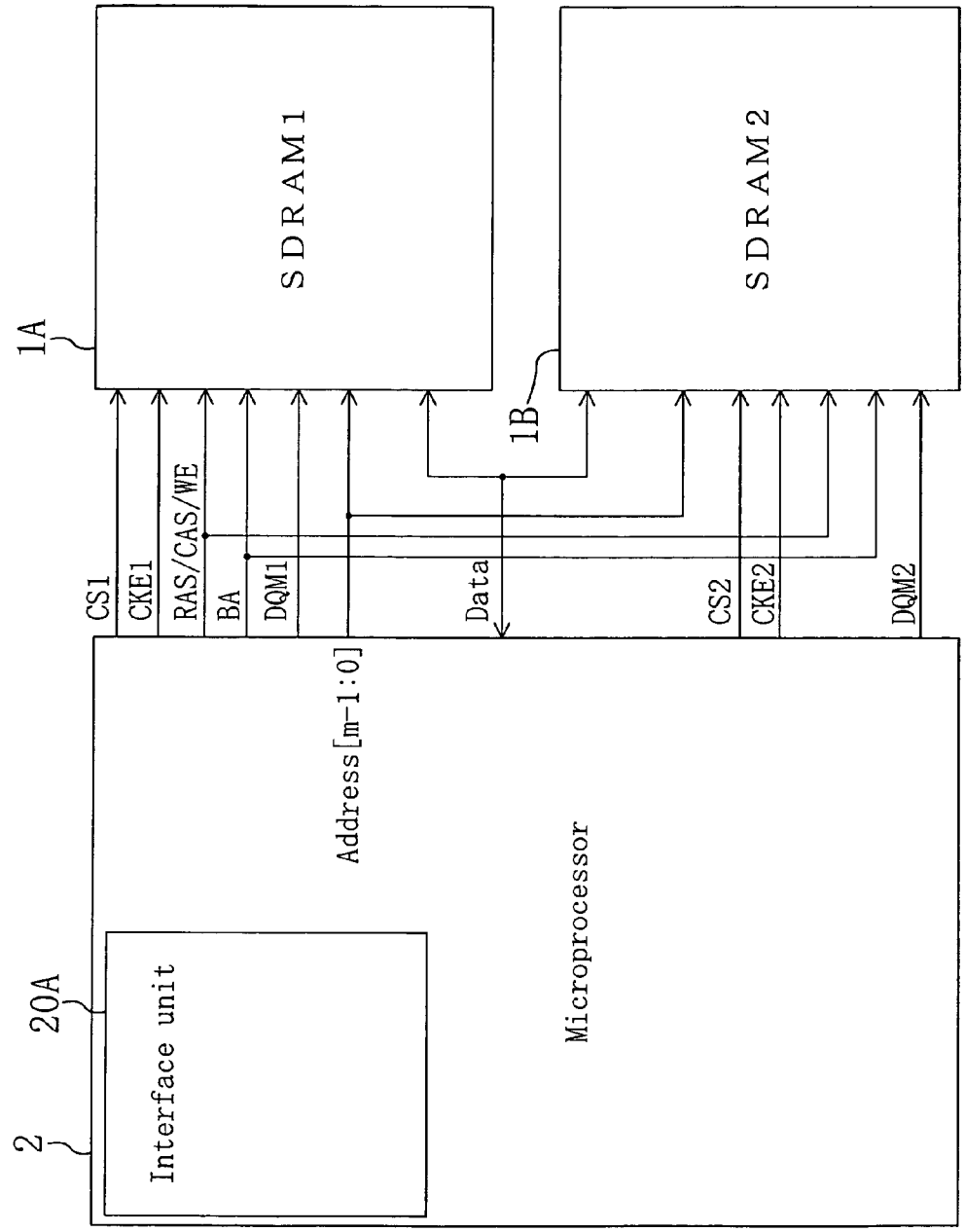
FIG. 6 illustrates a schematic configuration of a DRAM controller in accordance with a modified example of the first embodiment.
Figure 7:
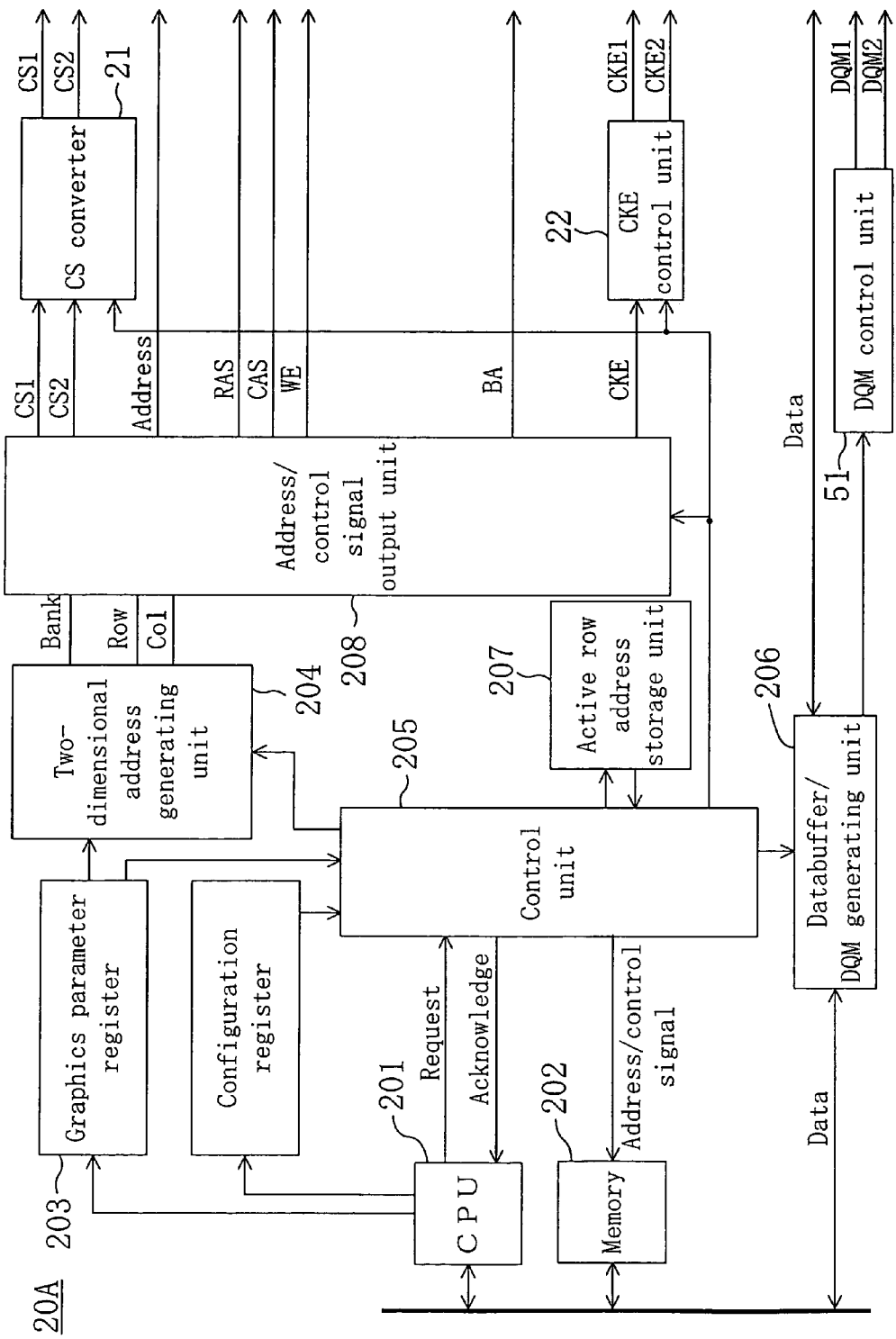
FIG. 7 is a block diagram illustrating the configuration of an interface unit of FIG. 6.
Figure 8:
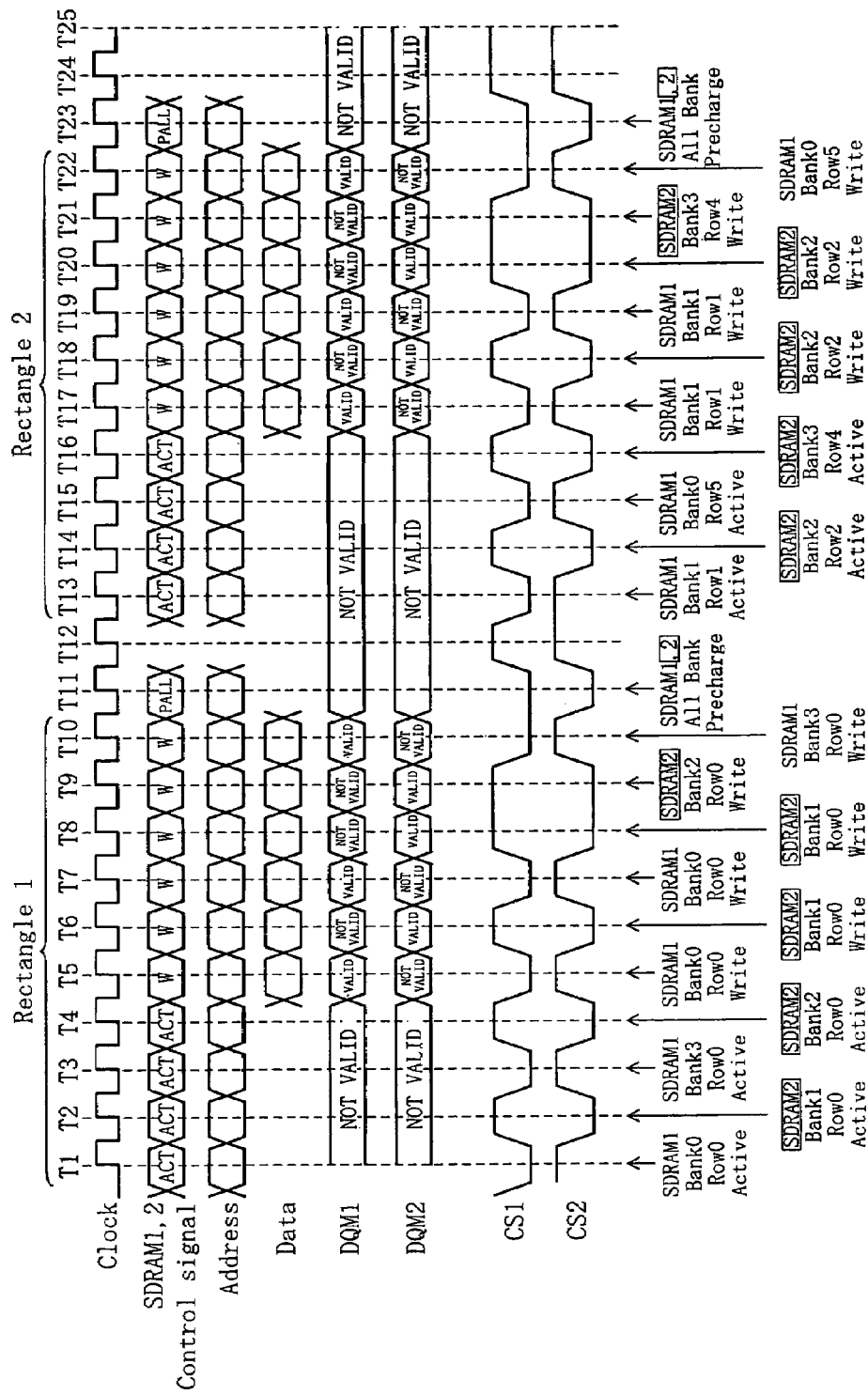
FIG. 8 is a timing chart indicating operation of the configuration shown in FIGS. 6 and 7.

FIGS. 6 and 7 illustrate a configuration in accordance with a modified example of this embodiment. In the example of FIGS. 6 and 7, an interface unit 20A includes a DQM control unit 51, which serves as a burst transfer control unit for outputting individual DQM signals DQM1 and DQM2 to first and second SDRAMs 1A and 1B. As shown in a timing chart of FIG. 8, the DQM control unit 51 controls the DQM signals DQM1 and DQM2 in such a manner that write data into the SDRAM2 is masked during a period of time in which writing into the SDRAM1 is performed, while write data into the SDRAM1 is masked during a period of time in which writing into the SDRAM2 is performed. As a result, the same effects as the above-mentioned effects of this embodiment are obtained.

Furthermore, in this embodiment, the first and second SDRAMs 1A and 1B use data lines in common. Therefore, when drawing data is read, data output produced from the SDRAMs has to be controlled by the DQM signals. Specifically, the DQM control unit 51, which acts as a read control unit, controls validation/invalidation of read data from the first and second SDRAMs 1A and 1B independently of each other.

In the configuration shown in FIGS. 6 and 7, in the case of data readout from the first SDRAM 1A, the signal CKE2 is activated, while the signal DQM2 that the DQM control unit 51, serving as the read control unit, outputs to the second SDRAM 1B is inactivated so that data output from the second SDRAM 1B is put to a high impedance state. By this control, data collision on the shared data line can be avoided. Similarly, when data is read from the second SDRAM 1B, the signal DQM1 is inactivated so as to put data output from the first SDRAM 1A to the high impedance state.

Although in this embodiment the address mapping in the frame-buffer area is performed in a checkered pattern as shown in FIG. 3, the present invention is not limited to this. So long as different DRAMs are assigned to any neighboring drawing blocks, similar effects are achieved. Furthermore, even in cases in which different DRAMs are assigned to any neighboring drawing blocks not in an entire frame-buffer area but in part of the frame-buffer area, similar effects are attained when a rectangle, e.g., is written into that part.

Figure 9:
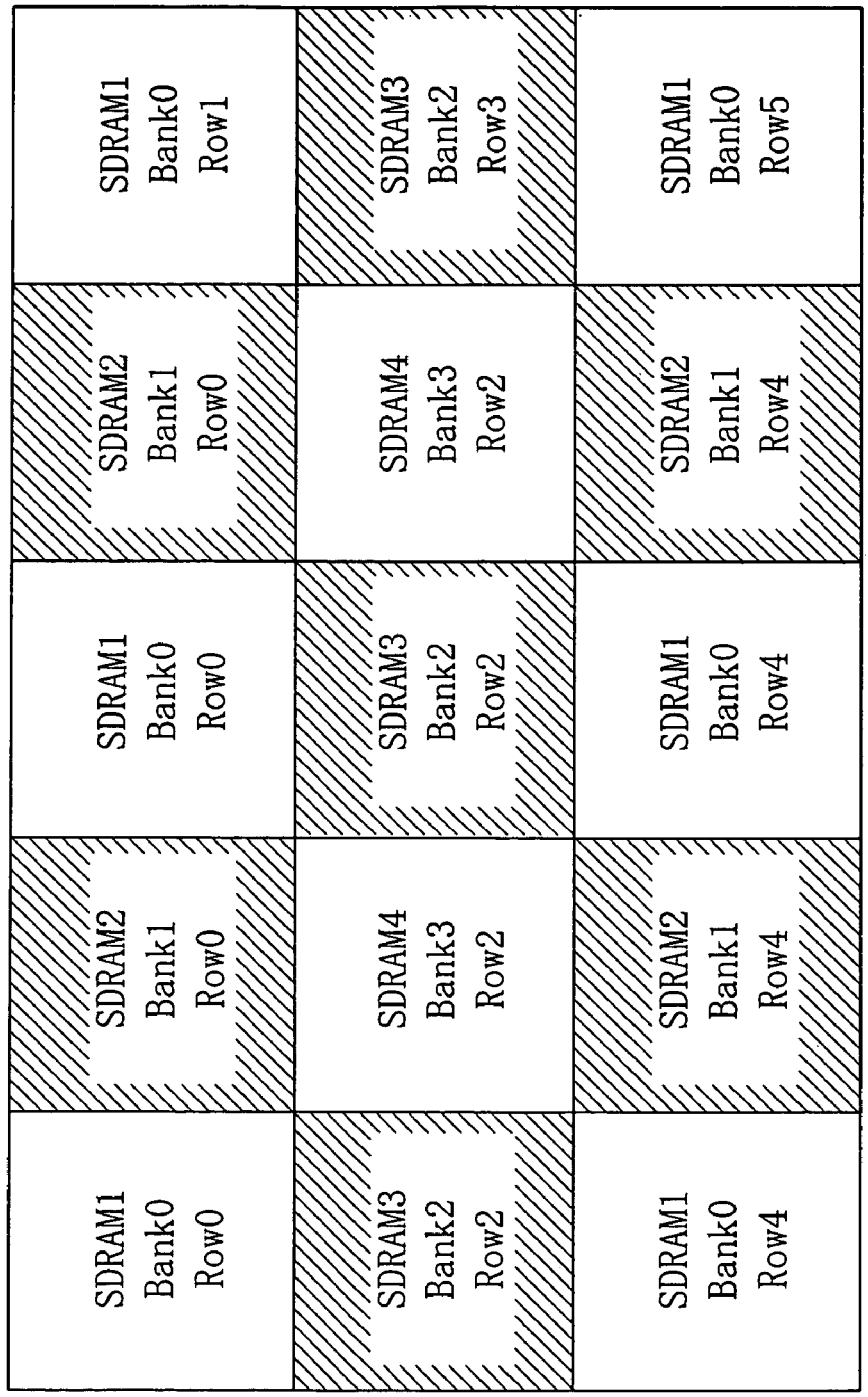
FIG. 9 illustrates exemplary address mapping using four DRAMs.

In this embodiment, the configuration in which two SDRAMs are used has been exemplified, but the number of SDRAMs is not limited to this. For instance, in a configuration using four SDRAMs, frame-buffer-area address mapping may be performed as shown in FIG. 9, for example.

Second Embodiment

Figure 10:
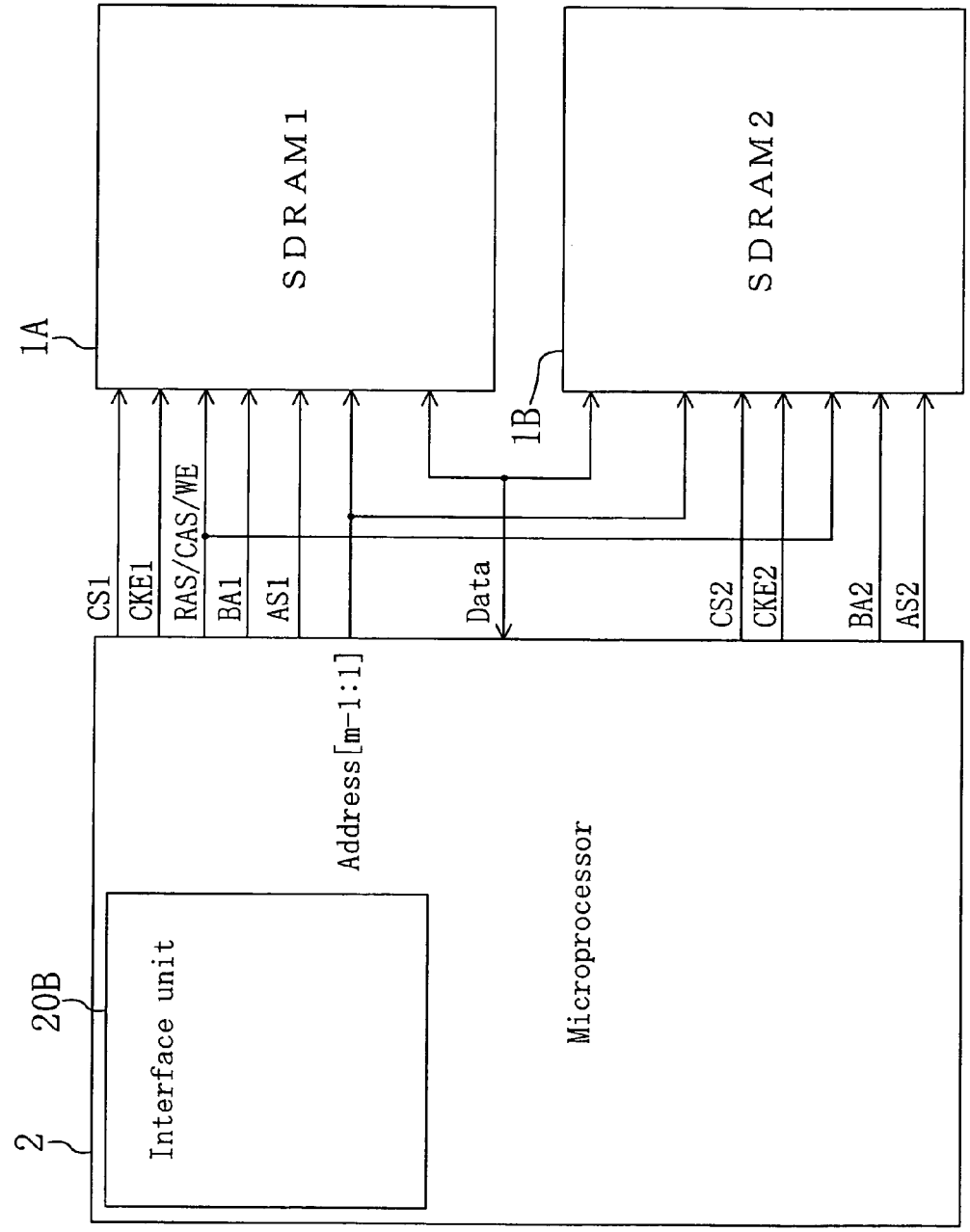
FIG. 10 illustrates a schematic configuration of a DRAM controller in accordance with a second embodiment of the present invention.
Figure 11:
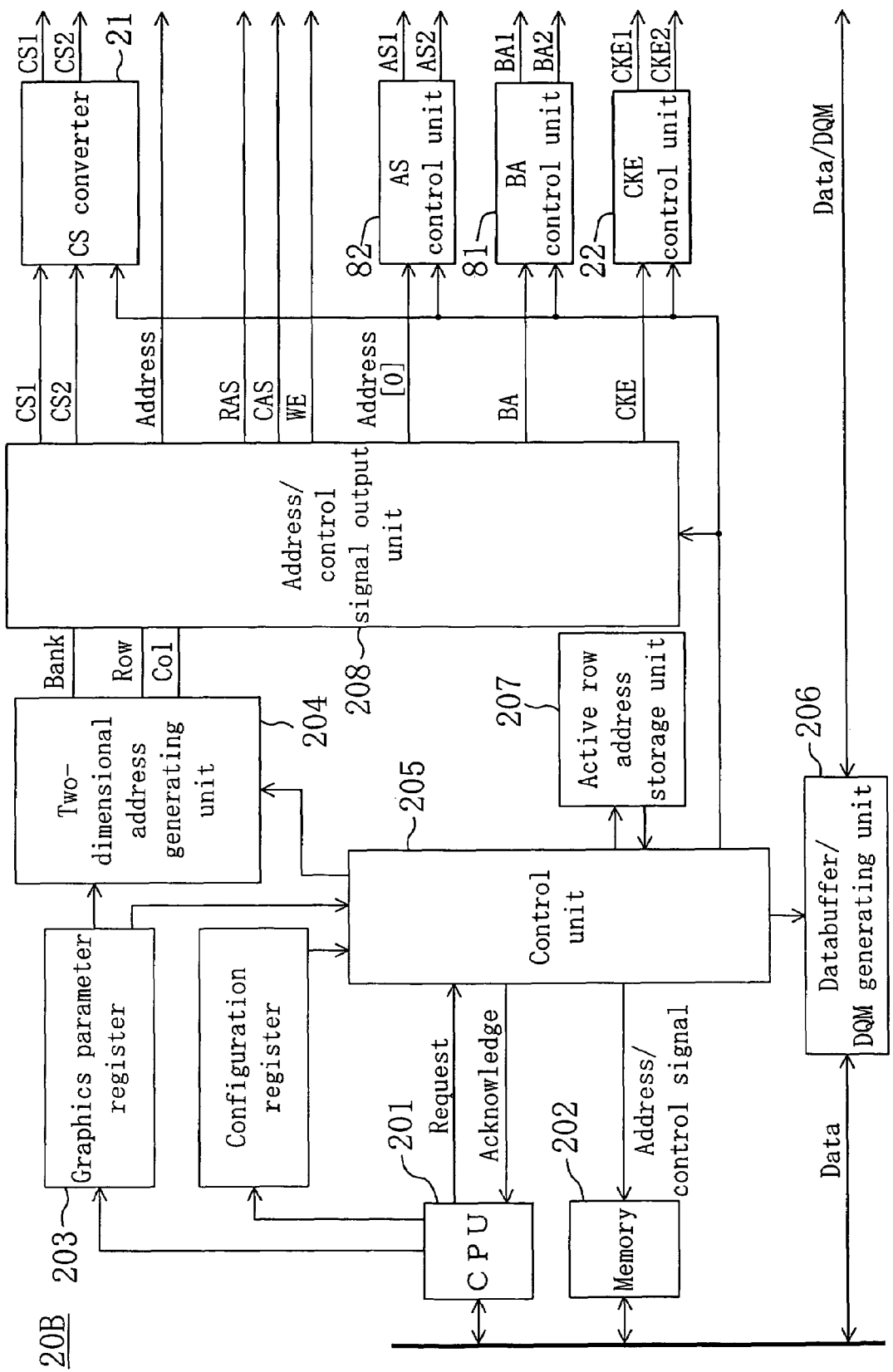
FIG. 11 is a block diagram illustrating the configuration of an interface unit of FIG. 10.

FIG. 10 illustrates a schematic configuration of a DRAM controller in accordance with a second embodiment of the present invention. FIG. 11 is a block diagram illustrating the configuration of an interface unit 20B of FIG. 10. In FIGS. 10 and 11, components common to those shown in FIGS. 1 and 2 are identified by the same reference numerals and the detailed description thereof will be omitted herein. In FIG. 11, a BA (bank select signal) control unit 81 outputs individual first and second bank select signals BA1 and BA2 to first and second SDRAMs 1A and 1B, respectively. An AS (address select signal) control unit 82 receives the 0th bit of an address output from an address/control-signal output unit 208 and outputs individual first and second address select signals AS1 and AS2 to the first and second SDRAMs 1A and 1B, respectively. The remaining bits of the address other than the 0th bit are supplied to both first and second SDRAMs 1A and 1B. The address/control-signal output unit 208, the BA control unit 81 and the AS control unit 82 form an address control unit of the present invention.

It is assumed that frame-buffer-area address mapping in this embodiment is performed as shown in FIG. 3 as in the first embodiment.

Hereinafter, a write operation in which rectangles 1 and 3 such as shown in FIG. 4 are consecutively written will be described by way of example of operation of the DRAM controller shown in FIGS. 10 and 11 with reference to a timing chart shown in FIG. 12.

Figure 12:
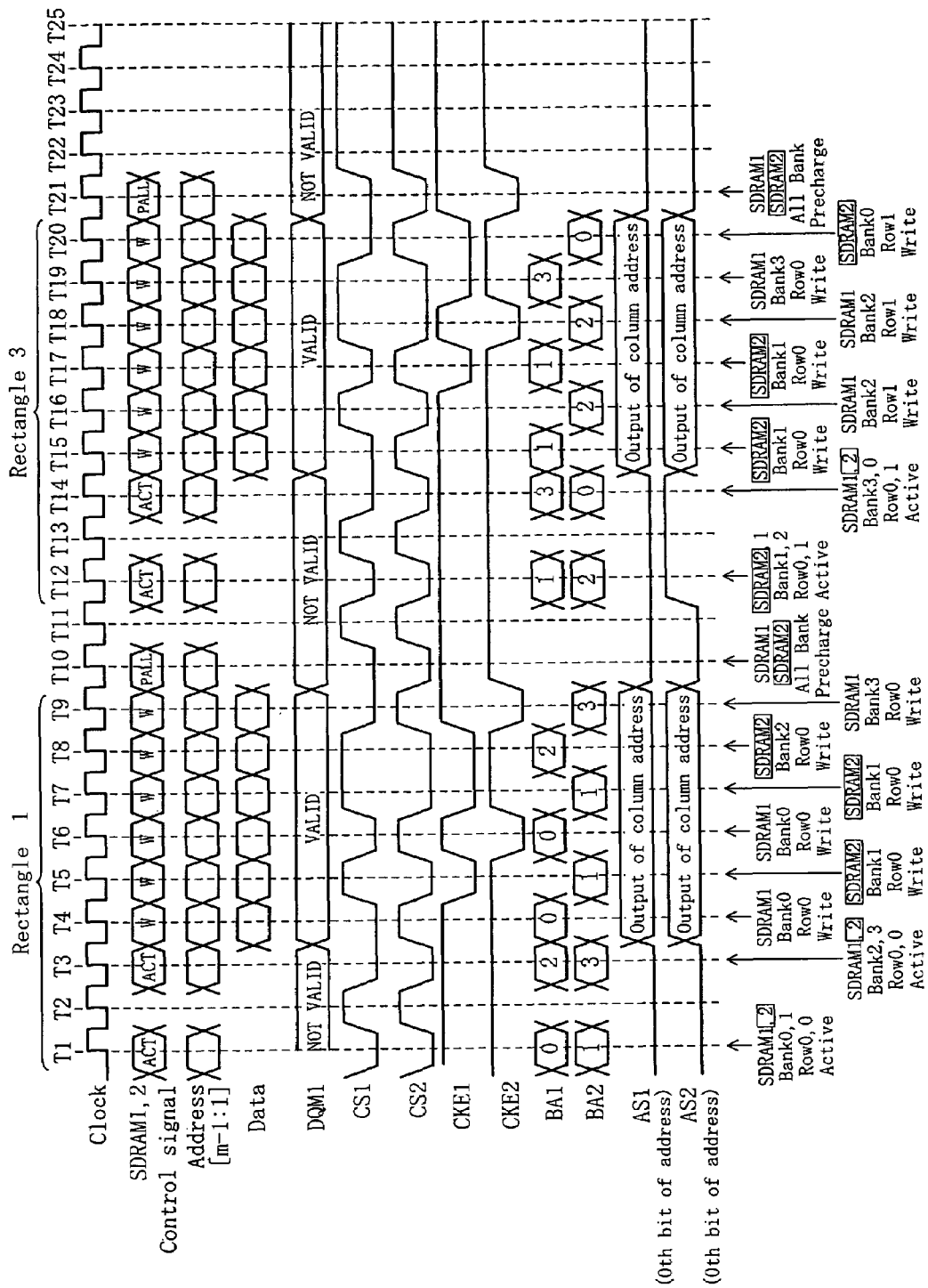
FIG. 12 is a timing chart indicating operation of the configuration shown in FIGS. 10 and 11.

First, in the example of FIG. 12, active commands are issued in a different manner from that of FIG. 5. More specifically, to write the rectangle 1, active commands are issued to both first and second SDRAMs 1A and 1B in cycles T1 and T3. Those commands activate the addresses of (SDRAM1, Bank0, Row0), (SDRAM2, Bank1, Row0), (SDRAM1, Bank3, Row0), and (SDRAM2, Bank2, Row0.) Together with these addresses, chip select signals CS1 and CS2 are also both activated in the cycles T1 and T3.

Next, it will be explained how to write drawing data of the rectangle 3. The rectangle 3 extends across four drawing blocks, namely (SDRAM2, Bank1, Row0), (SDRAM1, Bank2, Row1), (SDRAM1, Bank3, Row0), and (SDRAM2, Bank0, Row1).

Therefore, in an active command issued in a cycle T12, a signal that designates the bank 1 and a signal that designates the bank 2 are respectively output as the first and second bank select signals BA1 and BA2, and "0" and "1" are respectively output as the first and second address select signals AS1 and AS2, so as to activate the two addresses of (SDRAM2, Bank1, Row0) and (SDRAM1, Bank2, Row1). In an active command issued in a cycle T14, signals are output similarly.

As described above, the individual bank select signals BA1 and BA2 and the individual address select signals AS1 and AS2 are output to the first and second SDRAMs 1A and 1B, whereby the different banks and the different row addresses in the different SDRAMs can be activated in the same cycle.

During cycles T4 to T9 and T15 to T20 in which write commands are output, the 0th bit of an address output from the address/control-signal output unit 208 is output as it is as the address select signals AS1 and AS2.

As a result, in this embodiment, the number of cycles required for the consecutive writing of the rectangles 1 and 3 is 20, from the cycle T1 to the cycle T20, as shown in FIG. 12.

The required number of access cycles is reduced by four cycles as compared with the conventional case.

Also in this embodiment, the configuration in which two SDRAMs are used has been exemplified. However, the number of SDRAMs is not limited to this, so long as individual bank select signals and individual address signals are output to the SDRAMs. For example, assume a case where four SDRAMs are used to perform frame-buffer-area mapping as shown in FIG. 9. In this case, in an operation for writing a rectangle that extends across those four SDRAMs, the row addresses of the four banks in respective SDRAMs can be activated in one cycle, thereby reducing further the number of required cycles.

It should be noted that mapping of the banks and row addresses is not limited to those shown in FIGS. 3 and 9.

In this embodiment, the 0th bits of the address are output as the address select signals to respective SDRAMs, but the address select signal is not limited to the 0th bit. Address select signals of two or more bits may be output to respective SDRAMs. For instance, assume a configuration in which the least-significant two bits of address data are individually output as address select signals to respective SDRAMs. In this configuration, in processing the rectangle 2 of FIG. 4, the four drawing blocks can be activated by issuing an active command twice.

Figure 13:
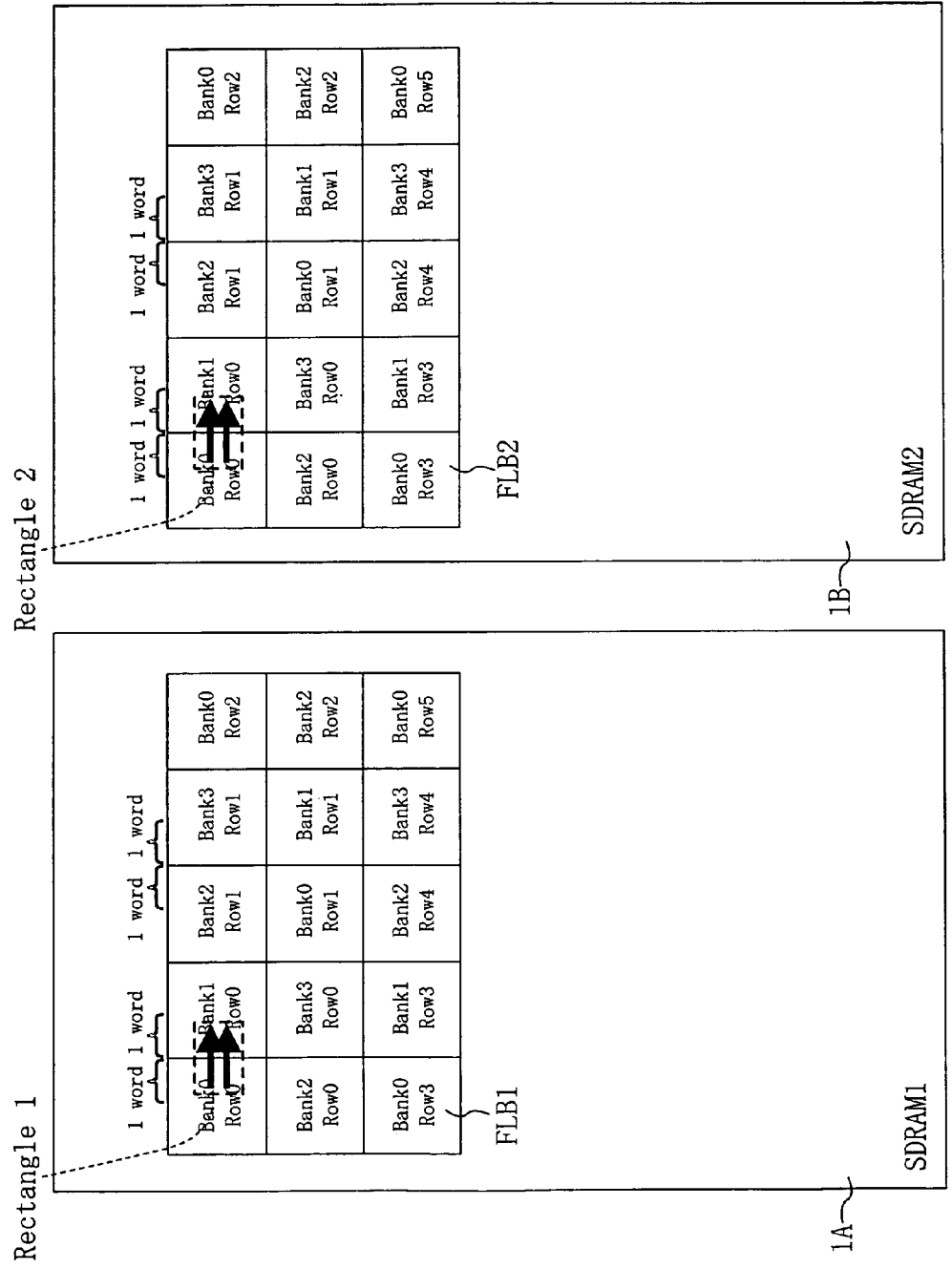
FIG. 13 illustrates exemplary mapping in which a plurality of frame-buffer areas are mapped to different DRAMs.

Also, as shown in FIG. 13, even in a case where a plurality of frame-buffer areas FLB1 and FLB2 are respectively mapped to the different first and second SDRAMs 1A and 1B, the same effects as those of the first and second embodiments are achieved. This mapping is applicable to a system in which drawing data of a single frame is written into a plurality of frame-buffer areas, and to read the drawing data, the drawing data is read alternately from the frame-buffer areas and combined together in a microprocessor 2.

In this case, drawing blocks common in the frame-buffer areas FLB1 and FLB2 are mapped to the different SDRAMs. It is therefore possible as in the first embodiment to reduce the number of command-issue waiting cycles required in activating the common drawing blocks. Furthermore, when the frame-buffer area is switched from one to the other, writing to or reading from the SDRAM assigned to the previous frame-buffer area is reliably stopped, thus requiring no cycle for stopping the burst transfer. This reduces overhead occurring when the plurality of frame buffer areas are used, thereby permitting the DRAM access to be executed with a smaller number of cycles as compared with the conventional case.

Moreover, as in the second embodiment, the common drawing blocks can be activated in the same cycle, such that the number of active-command issuing cycles is reduced.

Third Embodiment

Figure 14:
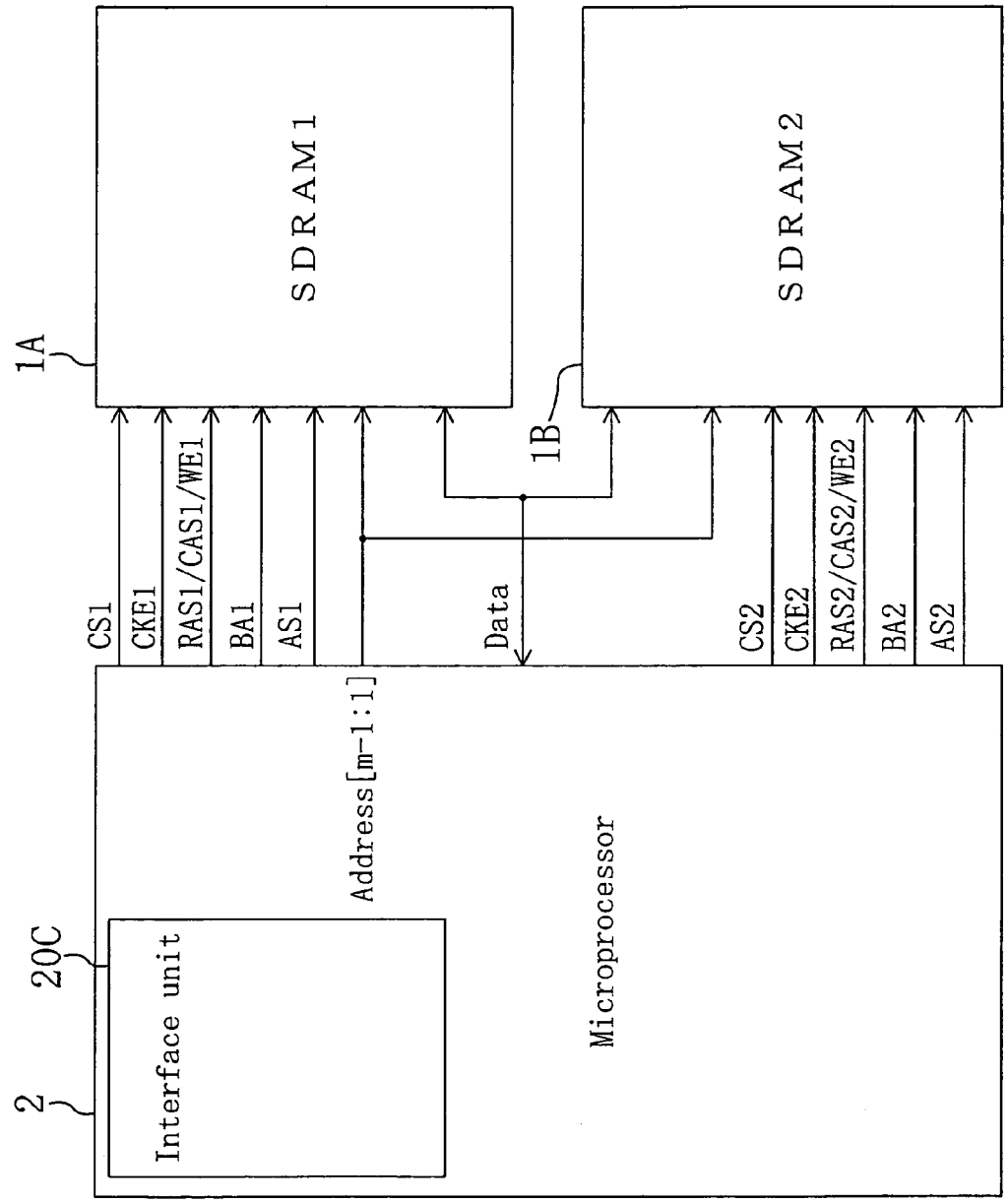
FIG. 14 illustrates a schematic configuration of a DRAM controller in accordance with a third embodiment of the present invention.
Figure 15:
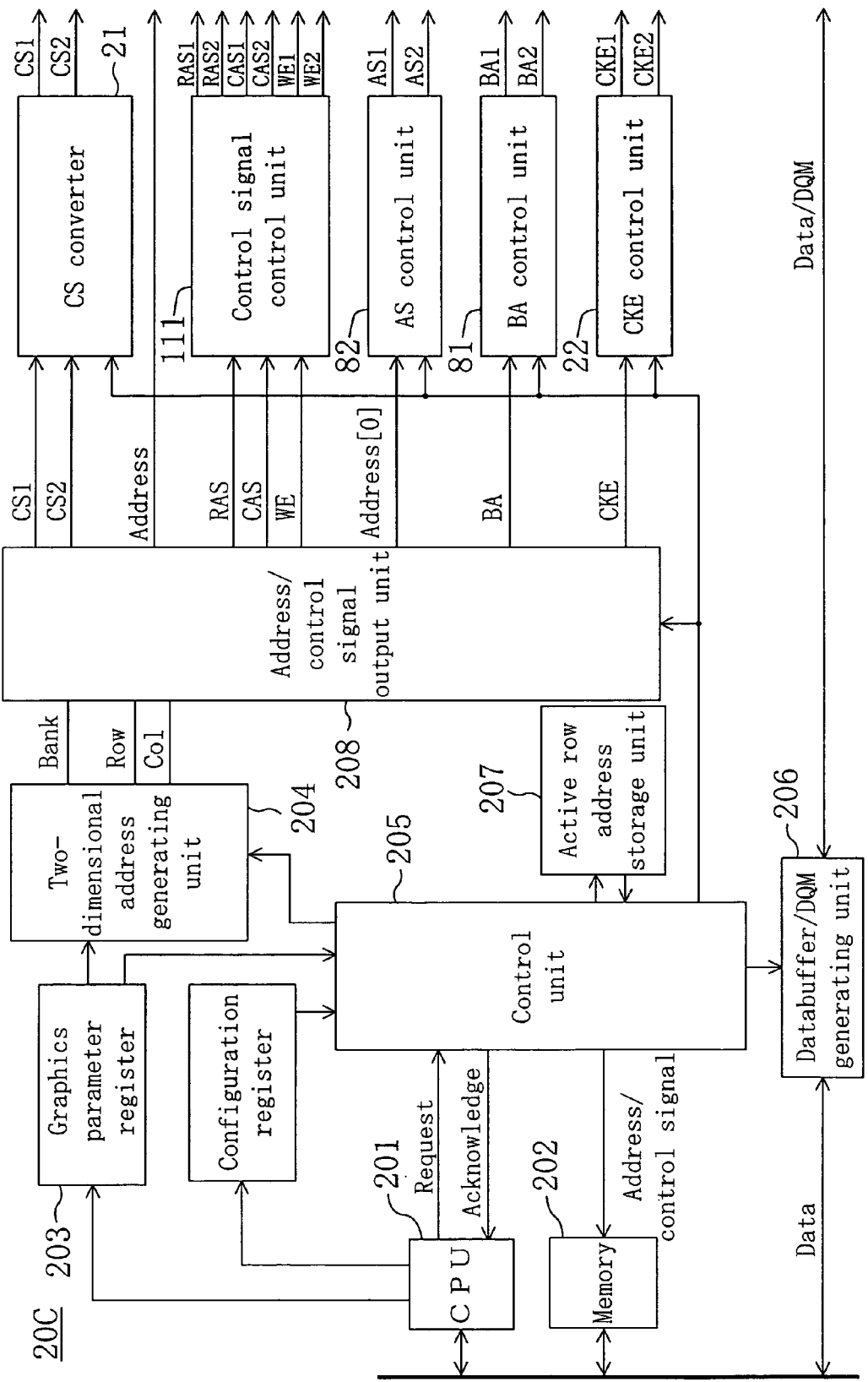
FIG. 15 is a block diagram illustrating the configuration of an interface unit of FIG. 14.

FIG. 14 illustrates a schematic configuration of a DRAM controller in accordance with a third embodiment of the present invention. FIG. 15 is a block diagram illustrating the configuration of an interface unit 20C of FIG. 14. In FIGS. 14 and 15, components common to those shown in FIGS. 1 and 2 or FIGS. 10 and 11 are identified by the same reference numerals and the detailed description thereof will be omitted herein.

In FIG. 15, a control signal control unit 111, serving as a command control unit, receives a RAS signal, a CAS signal and a WE signal output from an address/control signal control unit 208, and in order to issue individual commands to first and second SDRAMs 1A and 1B, the control signal control unit 111 outputs control signals RAS1, CAS1 and WE1 and control signals RAS2, CAS2 and WE2 to the first and second SDRAMs 1A and 1B, respectively.

It is assumed that frame-buffer-area address mapping in this embodiment is performed as shown in FIG. 3 as in the first embodiment.

Hereinafter, an operation in which a line segment 1 shown in FIG. 4 is written will be described by way of example of operation of the DRAM controller shown in FIGS. 14 and 15 with reference to a timing chart shown in FIG. 16.

Figure 16:
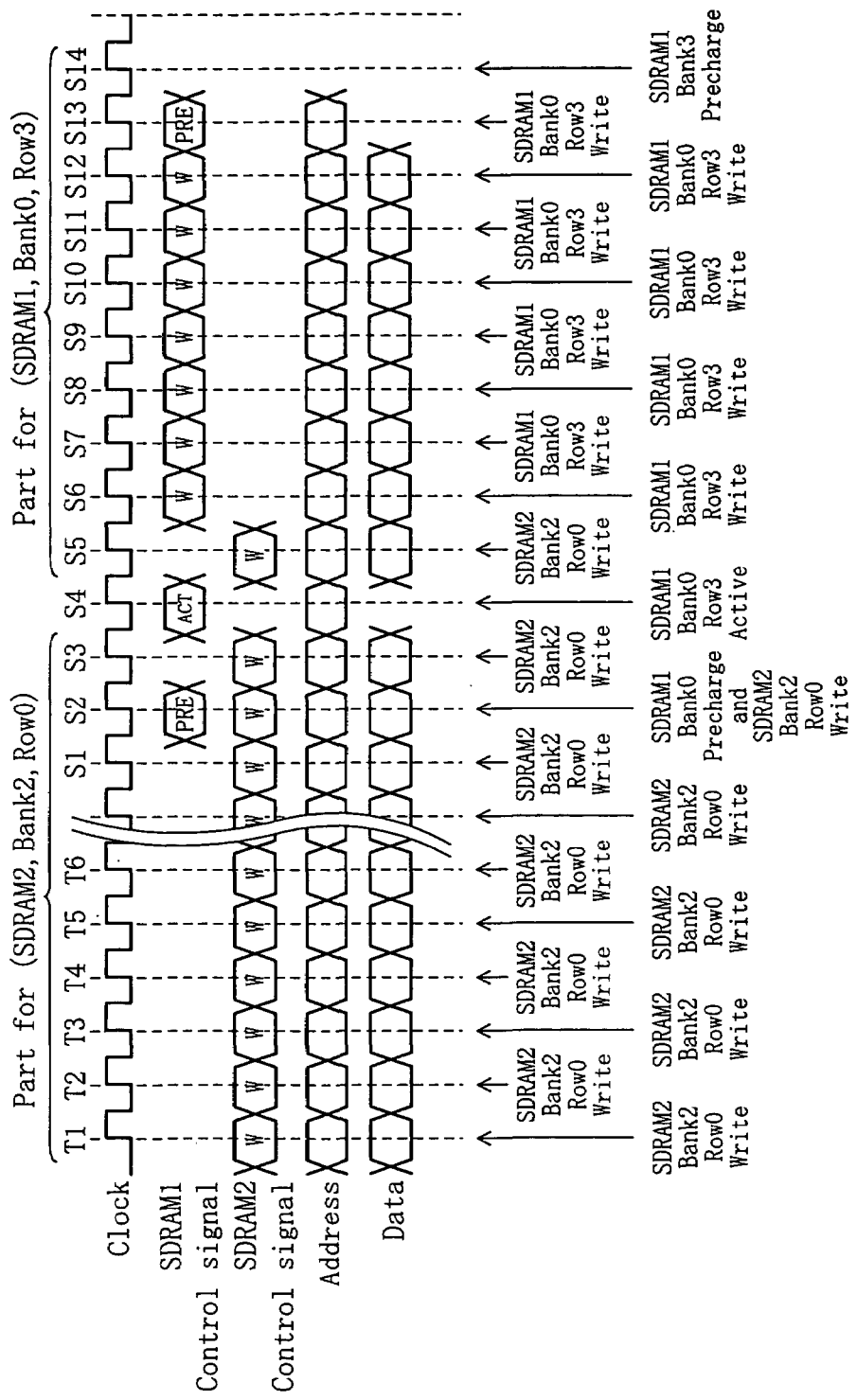
FIG. 16 is a timing chart indicating operation of the configuration shown in FIGS. 14 and 15.

As shown in FIG. 16, in this embodiment when the processing shifts from part for (SDRAM2, Bank2, Row0) to part for (SDRAM1, Bank0, Row3), a precharge command is issued to the SDRAM1 and a write command is issued to the SDRAM2 in a cycle S2. This reduces the number of cycles required for the access.

Specifically, the configuration in which individual commands can be issued to the first and second SDRAMs 1A and 1B enables the issuance of the different commands in the same cycle. Then, overhead caused in the access can be reduced in the writing of data such as the line segment 1 of FIG. 4, in which the burst transfer does not work effectively.

Furthermore, during a period of time in which one of the SDRAMs is accessed, a clock enable signal to the other SDRAM may be asserted. Then, power consumption by the SDRAMs is reduced.

Figure 17:
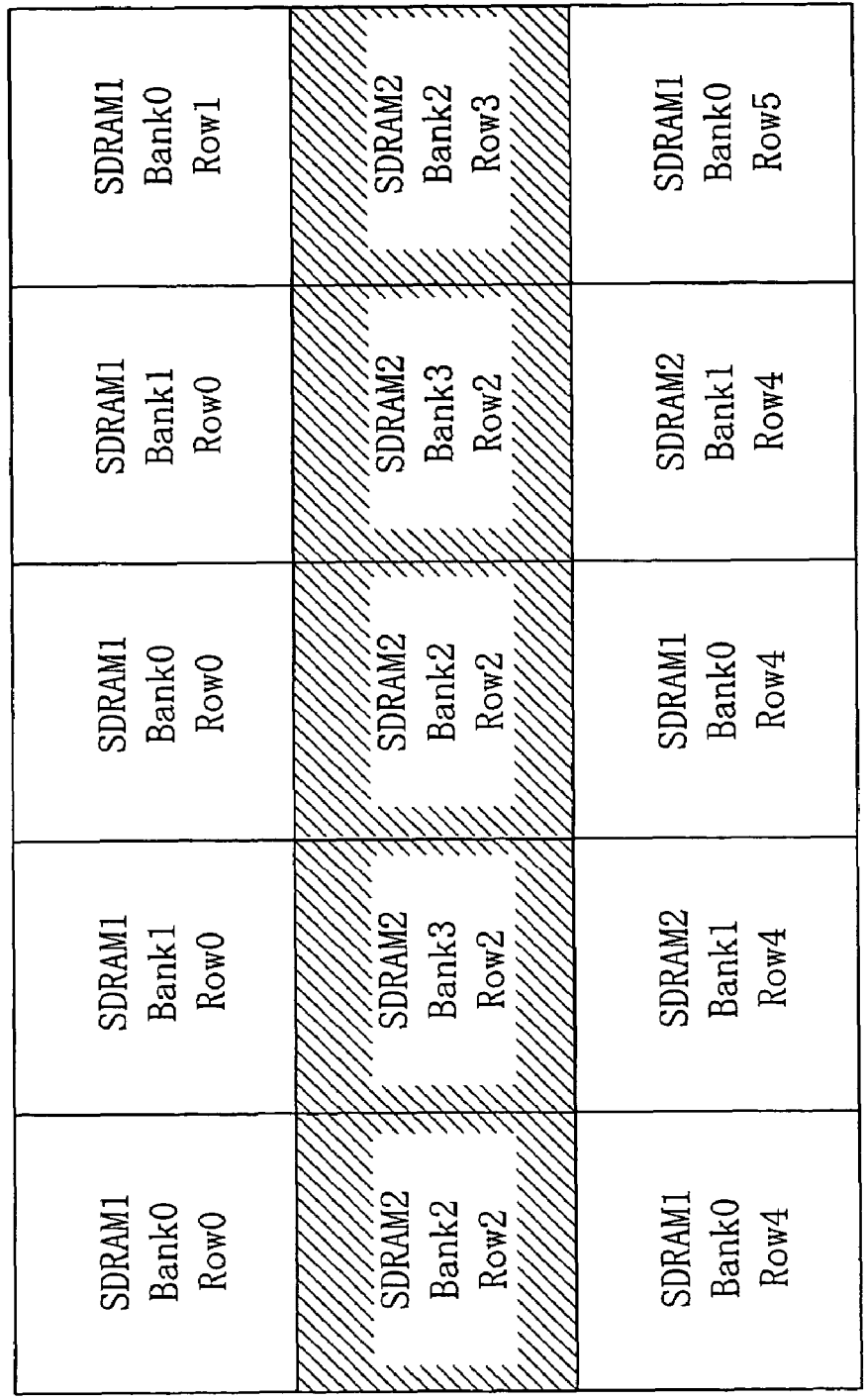
FIG. 17 illustrates other exemplary address mapping in a frame-buffer area.

In this embodiment, the address mapping of FIG. 3 is employed, but when other mapping, such as mapping in which the same SDRAM is used in the horizontal direction as shown in FIG. 17, is employed, similar effects are achieved. Mapping of the banks and row addresses is not limited to those shown in FIGS. 3 and 17.

Fourth Embodiment

Figure 18:
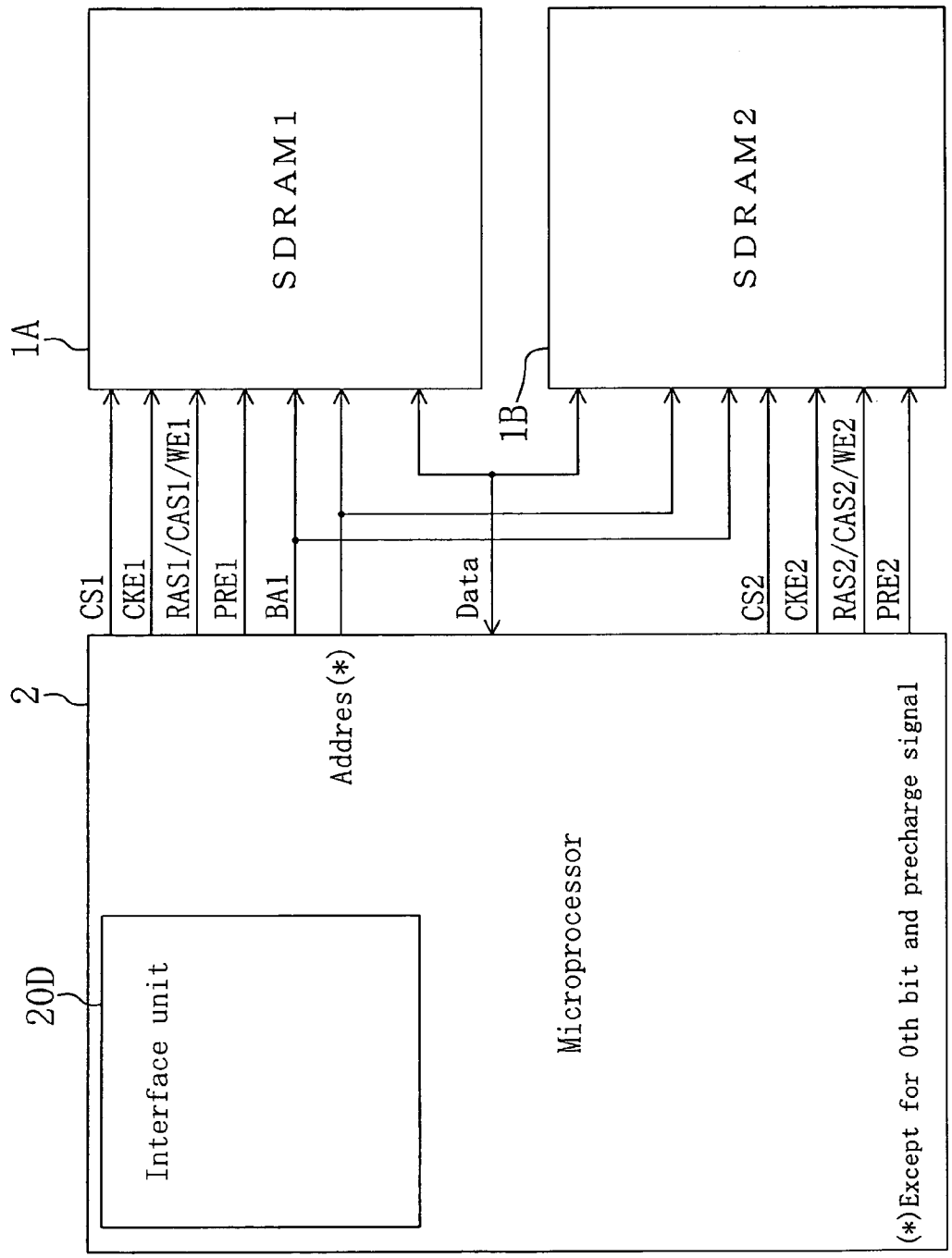
FIG. 18 illustrates a schematic configuration of a DRAM controller in accordance with a fourth embodiment of the present invention.
Figure 19:
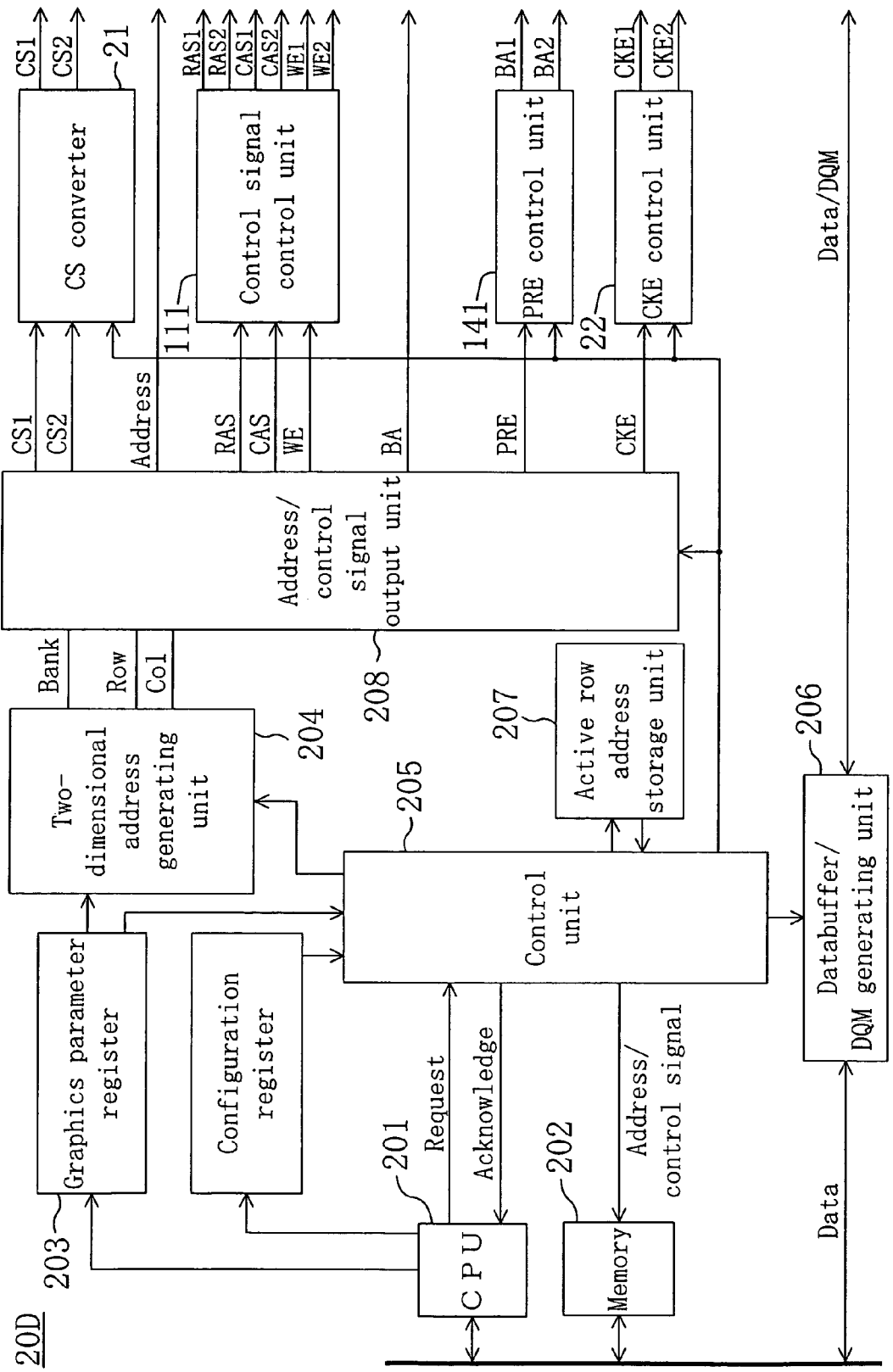
FIG. 19 is a block diagram illustrating the configuration of an interface unit of FIG. 18.
Figure 20:
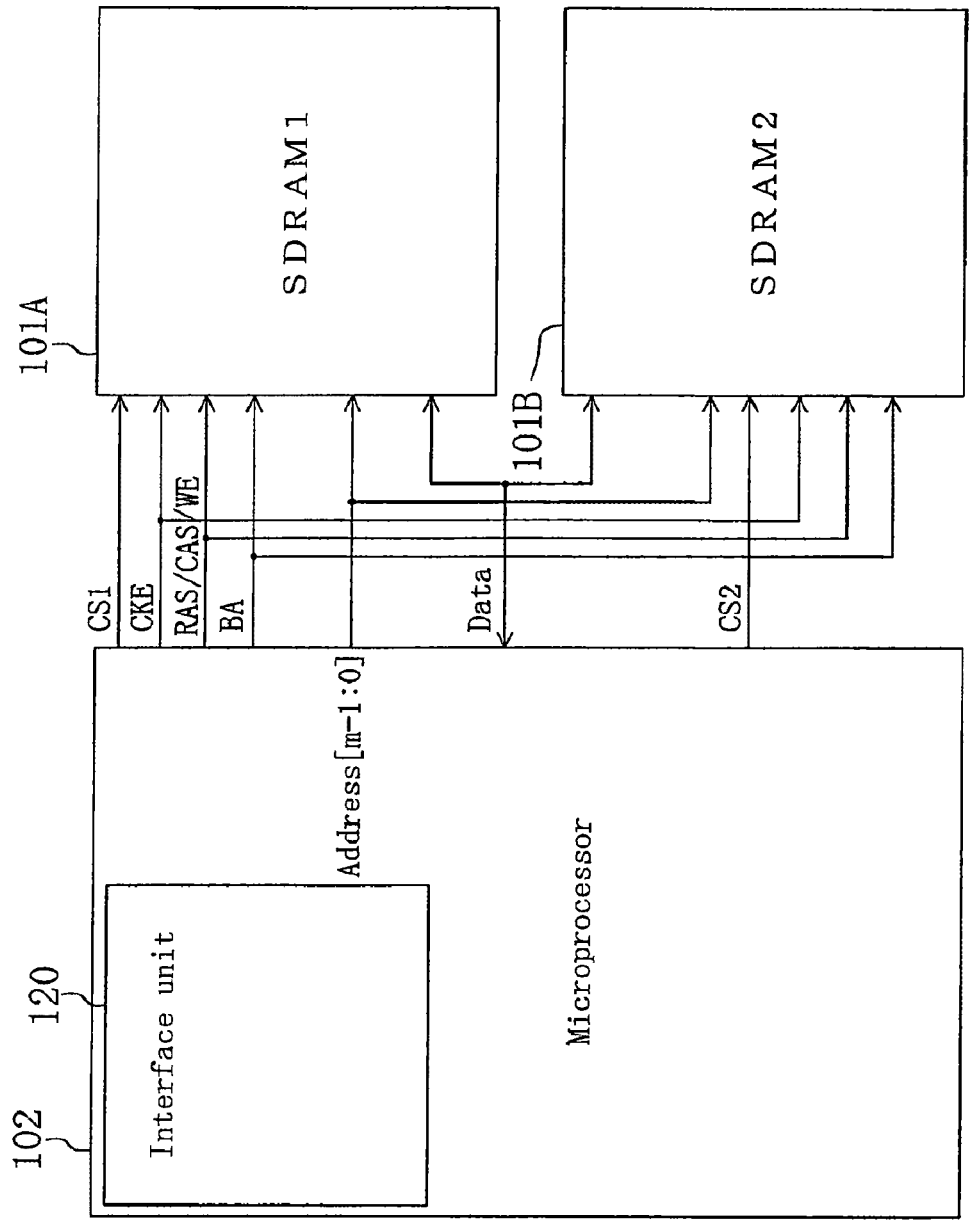
FIG. 20 illustrates a schematic configuration of a conventional DRAM controller.

FIG. 18 illustrates a schematic configuration of a DRAM controller in accordance with a fourth embodiment of the present invention. FIG. 19 is a block diagram illustrating the configuration of an interface unit 20D of FIG. 18. In FIGS. 18 and 19, components common to those in FIGS. 1 and 2 or FIGS. 14 and 15 are identified by the same reference numerals and the detailed description thereof will be omitted herein.

In FIG. 19, a PRE (precharge signal) control unit 141 receives a precharge signal output from an address/control-signal output unit 208. The precharge signal instructs simultaneous precharging of all banks when a precharge command is issued to an SDRAM. The PRE control unit 141 receives from a control unit 205 information on the SDRAM to which the precharge signal is to be output, and then outputs the precharge signal PRE1 or PRE2 to that SDRAM. A control signal control unit 111 and the PRE control unit 141 form a command control unit of the present invention.

In this embodiment, it is assumed that a plurality of frame-buffer areas FLB1 and FLB2 are mapped to SDRAMs 1A and 1B, respectively, as shown in FIG. 13.

This embodiment is characterized in that the SDRAM 1B is refreshed during a write operation of a rectangle 1. Specifically, in the configuration shown in FIGS. 18 and 19, signals RAS1, CAS1 and WE1 can be output to the first SDRAM 1A, while signals s RAS2, CAS2 and WE2 can be output to the second SDRAM 1B. Therefore, when data of the rectangle 1 is written into the first SDRAM 1A, the second SDRAM 1B can be precharged and refreshed. Before the refresh is performed, all banks in the SDRAM to be refreshed have to be precharged. Together with this precharge command, the precharge signal control unit 141 outputs a precharge signal.

In this embodiment, when one of the SDRAMs is accessed, the other SDRAM can be refreshed, thereby reducing the time necessary for the refresh.

In the present invention, when graphics processing is performed by assigning a frame-buffer area(s) to DRAMs, access time to the DRAMs can be reduced, thereby lowering the costs of the graphics processor and increasing the processing speed thereof.

What is claimed is:

1. A DRAM controller for controlling a plurality of DRAMs capable of burst transfers and having command-issuing interval restriction of a predetermined number of cycles, the plurality of DRAMs being independent from each other and each comprising a plurality of memory banks, comprising:
   a plurality of signal lines capable of connecting the plurality of DRAMs; and
   an interface unit which assigns to the DRAMs a frame-buffer area including a plurality of two-dimensionally arranged drawing blocks, and accesses the DRAMs in accordance with graphics processing,
   wherein the interface unit:
      assigns different ones of the DRAMs to neighboring ones of the drawing blocks at least in part of the frame-buffer area,
      issues, when performing a processing across the neighboring drawing blocks to which the different DRAMs are assigned, active commands alternately in consecutive cycles or simultaneously to each of the different DRAMs, and
      includes a burst transfer control unit for outputting individual signals to the DRAMs in order for stopping burst transfer of at least one of the plurality of DRAMs independently during burst transfer by another DRAMA,
   wherein at least one of the plurality of signal lines is shared by the plurality of DRAMs and the at least one of the signal lines shared by the plurality of DRAMs includes data signal lines for transmitting data signals.

2. The controller of claim 1, wherein the DRAMs include first and second DRAMs, and
   the interface unit assigns the first and second DRAMs to the drawing blocks in the frame-buffer area in a checkered pattern.

3. The controller of claim 1, wherein the interface unit includes an address control unit for outputting individual bank select signals and individual address signals to the DRAMs.

4. The controller of claim 3, wherein the interface unit assigns regions that have row addresses having a difference of 0 or 1 in the different DRAMs, to the neighboring drawing blocks at least in the part of the frame-buffer area, and
   the address control unit outputs individual 0th bits of the address signals to the DRAMs, while outputting commonly remaining bits thereof to the DRAMs.

5. The controller of claim 1, wherein the interface unit includes a command control unit which is configured so as to be capable of issuing individual control commands to the DRAMs.

6. The controller of claim 5, wherein the command control unit is capable of issuing a read command or a write command to one of the DRAMs and issuing a precharge command to another one of the DRAMs, in a common cycle.

7. The controller of claim 6, wherein the command control unit is capable of outputting a precharge signal together with issuing the precharge command.

8. The controller of claim 1, wherein the interface unit includes a read control unit for controlling validity/invalidity of read data from the DRAMs individually such that read data from only one of the plurality of DRAM becomes active at a time.

9. A DRAM controller for controlling a plurality of DRAMs capable of burst transfers and having command-issuing interval restriction of a predetermined number of cycles, the plurality of DRAMs being independent from each other and each comprising a plurality of memory banks, comprising:
   a plurality of signal lines capable of connecting the plurality of DRAMs; and
   an interface unit which assigns each of a plurality of frame-buffer areas including a plurality of two-dimensionally arranged drawing blocks to any one of the DRAMs, and accesses the DRAMs in accordance with graphics processing,
   wherein the interface unit:
      assigns different ones of the DRAMs to the respective frame-buffer areas,
      issues, when performing a processing across neighboring drawing blocks to which different DRAMs are assigned, active commands alternately in consecutive cycles or simultaneously to each of the different DRAMs, and
      includes a burst transfer control unit for outputting individual signals to the DRAMs in order for stopping burst transfer of at least one of the plurality of DRAMs independently during burst transfer by another DRAMA
   wherein at least one of the plurality of signal lines is shared by the plurality of DRAMs and the at least one of the signal lines shared by the plurality of DRAMs includes data signal lines for transmitting data signals.

10. A control method in the DRAM controller of claim 1, comprising:
    a step in which the interface unit receives an instruction to perform graphics processing that extends across adjacent first and second drawing blocks to which first and second DRAMs included in the DRAMs have been respectively assigned;
    a step in which in accordance with the instruction, the interface unit instructs the first DRAM to perform a burst write to or a burst read from an area corresponding to the first drawing block; and
    a step in which in accordance with the instruction, the interface unit instructs the second DRAM to perform a burst write to or a burst read from an area corresponding to the second drawing block, while the burst transfer control unit outputs to the first DRAM the signal for stopping burst transfer.

11. A control method in the DRAM controller of claim 9, comprising:
    A step in which the inteface unit receives an instruction to perform graphics processing using first and second frame-buffer areas assigned respectively to first and second DRAMs included in the DRAMs;
    a step in which in accordance with the instruction, the interface unit instructs the first DRAM to perform a burst write to or a burst read from the first frame-buffer area; and
    a step in which in accordance with the instruction, the interface unit instructs the second DRAM to perform a burst write to or a burst read from the second frame-buffer area, while the burst transfer control u nit outputs to the first DRAM the signal for stopping burst transfer.

12. The controller of claim 1, wherein the individual signals are individual clock enable signals, and the individual clock enable signals are input to the plurality of DRAMs using a part of the plurality of signal lines in order to stop burst transfer of each of the plurality of DRAMs independently.

13. The controller of claim 12, wherein burst tranfer of each DRAM is stopped by activating individual clock enable signal respectively.

14. The controller of claim 9, wherein the individual signals are individual clock enable signals, and the individual clock enable signals are input to the plurality of DRAMs using a part of the plurality of signal lines in order to stop burst transfer of each of the plurality of DRAMs independently.

15. The controller of claim 14, wherein the burst transfer of each DRAM is stopped by activating individual clock enable signal respectively.

\* \* \* \* \*